(12) United States Patent
Young et al.

(10) Patent No.: US 11,217,494 B1
(45) Date of Patent: Jan. 4, 2022

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Bo-Feng Young, Taipei (TW); Sai-Hooi Yeong, Zhubei (TW); Chi On Chui, Hsinchu (TW); Yu-Ming Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/945,103

(22) Filed: Jul. 31, 2020

(51) Int. Cl.
*H01L 21/8239* (2006.01)
*H01L 27/11568* (2017.01)
(Continued)

(52) U.S. Cl.
CPC .... *H01L 21/8239* (2013.01); *H01L 21/02565* (2013.01); *H01L 21/02603* (2013.01); *H01L 21/76816* (2013.01); *H01L 21/76877* (2013.01); *H01L 27/1159* (2013.01); *H01L 27/11568* (2013.01); *H01L 27/11578* (2013.01); *H01L 27/11597* (2013.01); *H01L 29/0673* (2013.01);
(Continued)

(58) Field of Classification Search
CPC ......... H01L 21/02518; H01L 21/02521; H01L 21/02565; H01L 21/02587; H01L 21/02603; H01L 21/76816; H01L 21/76877; H01L 21/823412; H01L 21/823431; H01L 21/823437; H01L 21/8239; H01L 27/105; H01L 27/1052; H01L 27/115; H01L 27/11568; H01L 27/11578; H01L 27/1159; H01L 27/11597; H01L 29/0673; H01L 29/24; H01L 29/41; H01L 29/4232; H01L 29/42392; H01L 29/66969; H01L 29/78; H01L 29/78391; H01L 29/785; H01L 29/786; H01L 29/78696
See application file for complete search history.

(56) References Cited

U.S. PATENT DOCUMENTS 9,209,247 B2   12/2015   Colinge et al.
9,236,267 B2   1/2016   De et al.
(Continued)

*Primary Examiner* — Cheung Lee
(74) *Attorney, Agent, or Firm* — Slater Matsil, LLP

(57) ABSTRACT

3D-NOR memory array devices and methods of manufacture are disclosed herein. A method includes forming a multi-layer stack over a substrate by forming alternating layers of an isolation material and a dummy material. An array of dummy nanostructures is formed in a channel region of the multi-layer stack by performing a wire release process. Once the nanostructures have been formed, a single layer of an oxide semiconductor material is deposited over and surrounds the dummy nanostructures. A memory film is then deposited over the oxide semiconductor material and a conductive wrap-around structure is formed over the memory film. Source/bit line structures may be formed by replacing the layers of the dummy material outside of the channel region with a metal fill material. A staircase conductor structure can be formed the source/bit line structures in a region of the multi-layer stack adjacent the memory array.

20 Claims, 21 Drawing Sheets

(51) Int. Cl.
   *H01L 29/66* (2006.01)
   *H01L 27/1159* (2017.01)
   *H01L 27/11597* (2017.01)
   *H01L 29/06* (2006.01)
   *H01L 29/24* (2006.01)
   *H01L 29/423* (2006.01)
   *H01L 29/786* (2006.01)
   *H01L 29/78* (2006.01)
   *H01L 21/768* (2006.01)
   *H01L 21/02* (2006.01)
   *H01L 27/11578* (2017.01)

(52) U.S. Cl.
   CPC ........ *H01L 29/24* (2013.01); *H01L 29/42392* (2013.01); *H01L 29/66969* (2013.01); *H01L 29/78391* (2014.09); *H01L 29/78696* (2013.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2021/0036019 A1* | 2/2021 | Sharangpani ..... H01L 27/11587 |

\* cited by examiner

SEMICONDUCTOR DEVICES AND METHODS OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
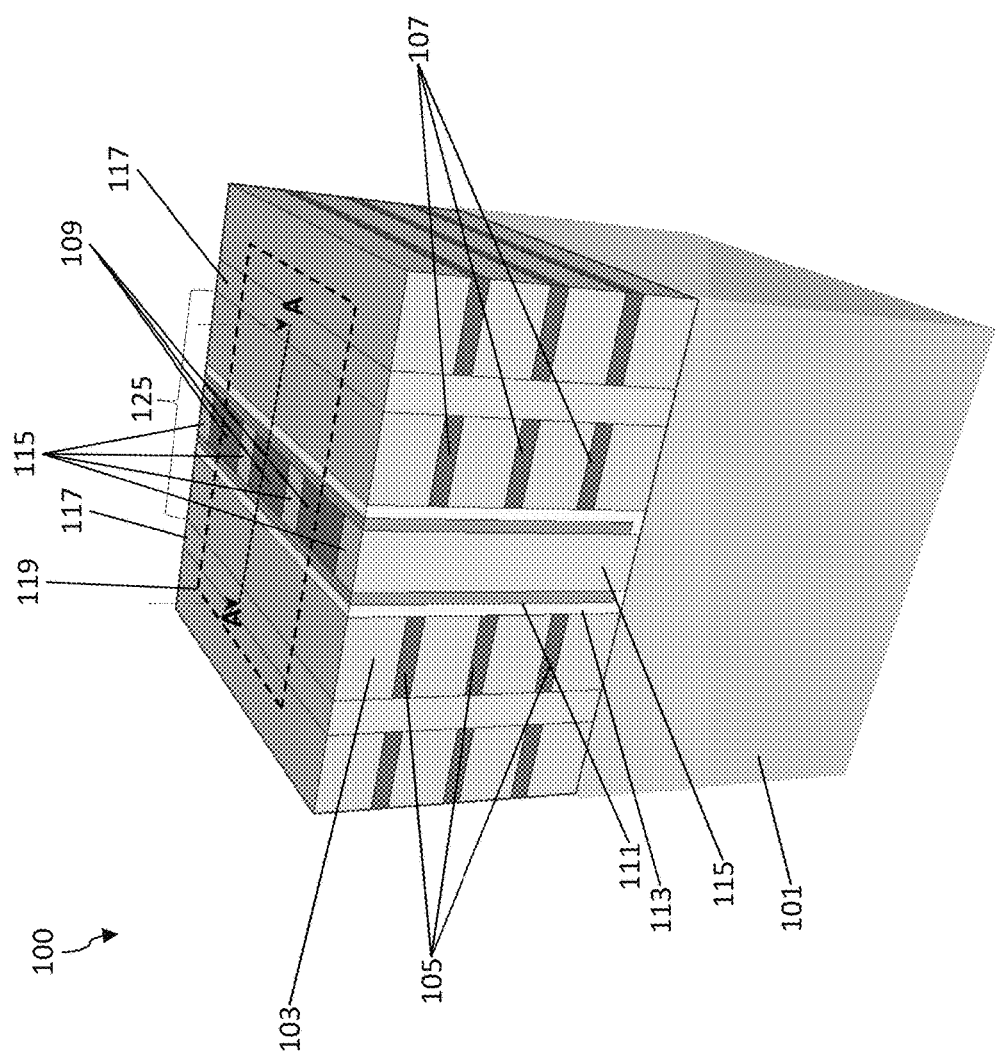
FIGS. 1A-1D illustrate a 3D NOR memory array, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a particular embodiment which forms a 3-dimensional (3D) memory array including a plurality of NOR gate-all-around (GAA) stacked memory cells. However, the embodiments described are intended to be illustrative and are not intended to be limited to those embodiments that are expressly described herein. Rather, the ideas presented herein may be incorporated into a wide variety of embodiments.

With reference now to FIGS. 1A-1D, these figures illustrate an example of a 3D memory array 100, in accordance with some embodiments. The 3D memory array 100 may be a NOR gate-all-around (GAA) memory array. In the illustrated embodiment, the 3D memory array 100 is formed as a 3×3 matrix of vertically stacked memory cells 125. However, other embodiments of the 3D memory array 100 may comprise more memory cells or fewer memory cells and all such memory arrays are within the scope of the present disclosure.

In particular, FIG. 1A illustrates in a perspective view the 3D memory array 100 over a substrate 101, according to some embodiments. The 3D memory array 100 comprises isolation layers 103 separating source lines 105 and bit lines 107 of a plurality of vertically stacked memory cells 125. The source lines 105 and bit lines 107 may be referred to herein as source line structures, bit line structures, source/bit lines, or source/bit line structures.

FIG. 1A further illustrates word lines 109 of the vertically stacked memory cells 125 that are separated from the source lines 105 and the bit lines 107 via an semiconductor layer 113 and a memory film 111 internally within the 3D memory array 100. The word lines 109 may be referred to herein as word line structures.

The semiconductor layer 113 is isolated from the word lines 109 by the memory film 111. The semiconductor layer 113 may be referred to herein as a channel wrap-around structure, an oxide wrap-around layer, an oxide channel wrap-around structure, an oxide semiconductor structure, or an oxide wrap-around structure. Further still, FIG. 1A illustrates gate isolation plugs 115 that separate the word lines 109 of the stacked memory cells from one another and array spacers 117 separating the 3D memory array 100 from adjacent memory arrays. FIG. 1A further illustrates a first section 119 highlighted by a dashed line and a cross-section A-A which will be referenced with regard to the following discussion and figures.

Figure 1B:
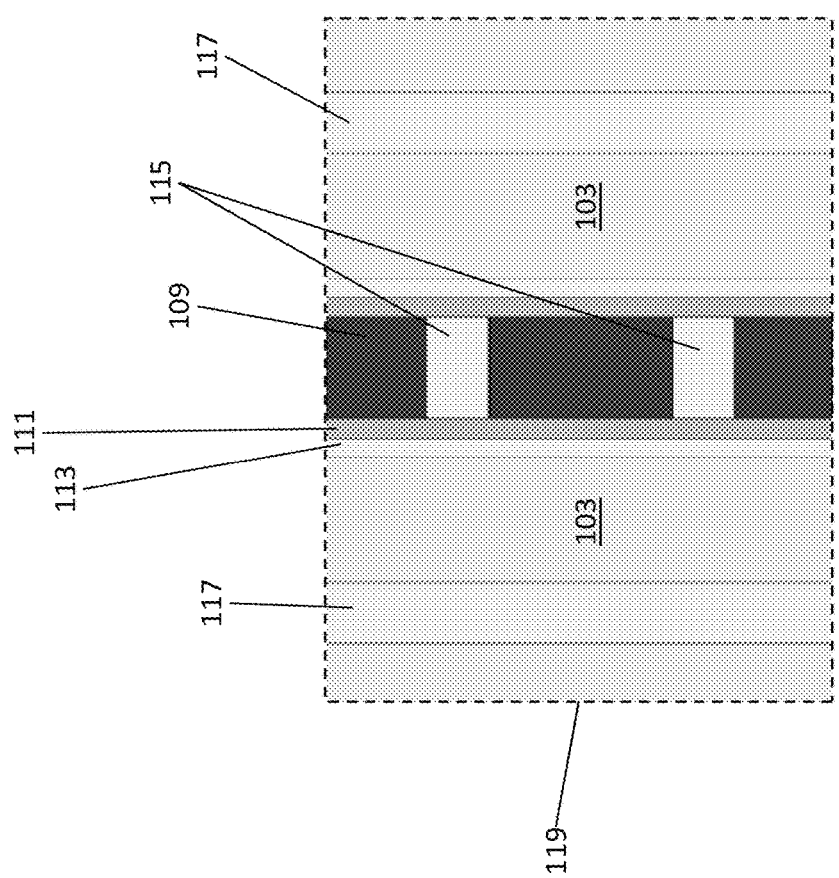

FIG. 1B illustrates a magnified top-down view of the first section 119 of FIG. 1A. FIG. 1B shows the word lines 109 separated by the gate isolation plugs 115 and the array spacers 117 separating the 3D memory array 100 from adjacent memory arrays. FIG. 1B also shows the memory film 111 interfacing the word lines 109 and separating the semiconductor layer 113 from the word lines 109.

Figure 1C:
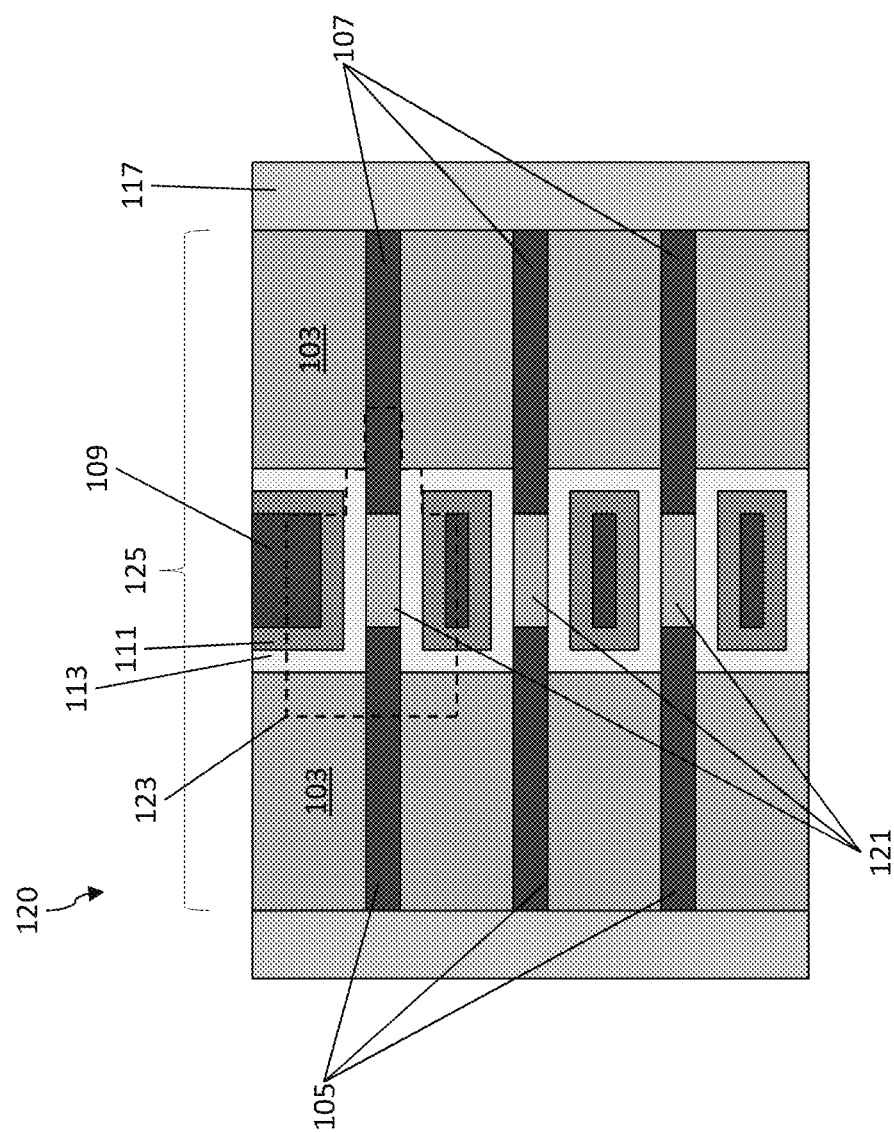

FIG. 1C illustrates a cross-sectional view of the cut-line A-A of FIG. 1A, in accordance with some embodiments. In particular, FIG. 1C illustrates a memory cell stack 120 of the 3D memory array 100, in accordance with some embodiments. In the illustrated embodiment, the memory cell stack 120 comprises one of the word lines 109 operatively coupled to three of the source lines 105 and to three of the bit lines 107 via the memory film 111. The isolation layers 103 separate the source lines 105 from one another and the bit lines 107 from one another. FIG. 1C further illustrates a dummy channel core 121 separating the source lines 105 from the bit lines 107. The semiconductor layer 113 isolates the memory film 111 from the dummy channel core 121, the source lines 105, and the bit lines 107. FIG. 1C still further illustrates a unit memory cell 123 of the memory cell stack 120 and is highlighted with a dashed line.

Figure 1D:
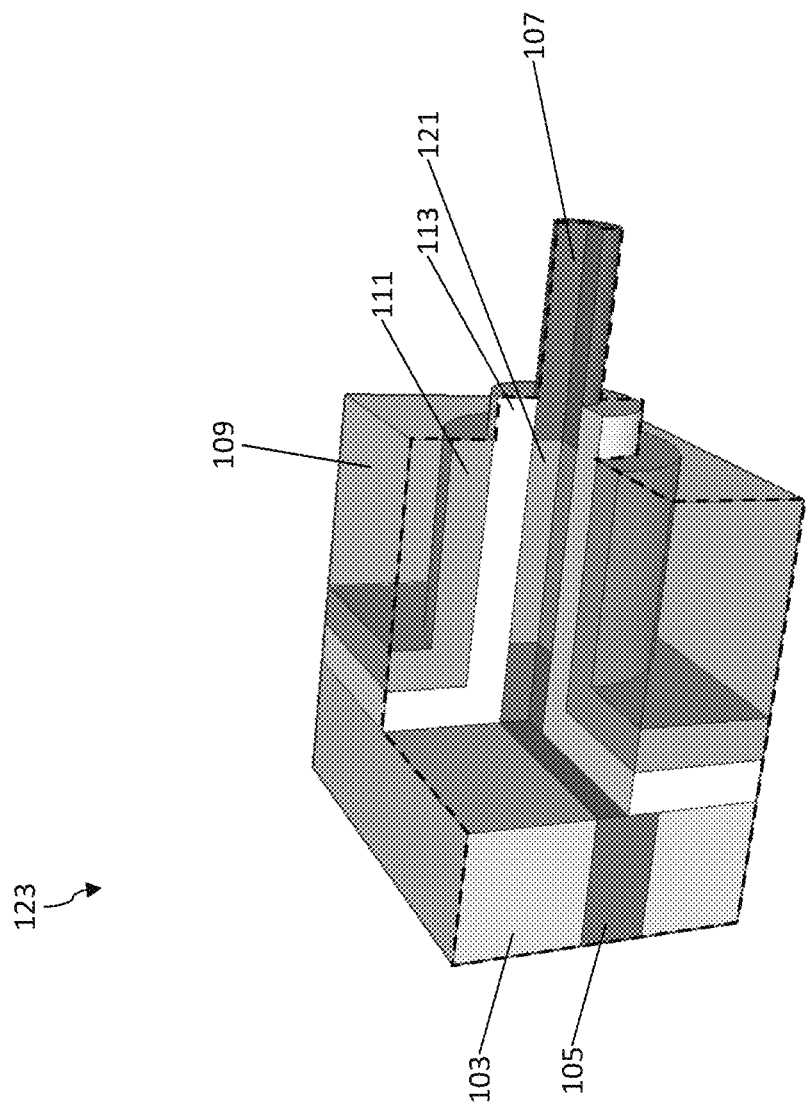

FIG. 1D illustrates in a perspective view the unit memory cell 123 of FIG. 1C, in accordance with some embodiments. The unit memory cell 123 is illustrated in FIG. 1D with a quarter section removed from its structure and with the word line 109 shown as transparent to show the interfaces between structures internal to the unit memory cell 123. In particular, FIG. 1D illustrates the dummy channel core 121 separating the source line 105 from the bit line 107 and the semiconductor layer 113 surrounds the dummy channel core 121. As such, the semiconductor layer 113 is referred to herein as a channel wrap-around structure. The semiconductor layer 113 also covers the vertical sidewall of the isolation layers 103 and isolates the dummy channel core 121, the source line 105 and the bit line 107 from the memory film 111. The memory film 111 surrounds the semiconductor layer 113 and isolates the word line 109 from the semiconductor layer 113. The word line 109 surrounds the memory film 111. The word lines 109 may be referred to herein as wrap-around electrodes.

With reference now to FIGS. 2-12C, these figures illustrate intermediate stages in the formation of the 3D memory array 100, in accordance with some embodiments. These figures illustrate an embodiment of the 3D memory array 100 comprising a 3×3 memory array including three of the word lines 109, three of the source lines 105, and three of the bit lines 107. This embodiment is for illustration purposes and any suitable array size may be used. The memory array 100 may comprise larger sized arrays (e.g., 4×4, 5×5, 6×6, . . . etc.), smaller sized arrays (e.g., 1×1, 2×2), irregular size arrays (e.g., 2×3, 2×4, 2×5, 2×6 . . . 3×2, 3×4, 3×5, 3×6, . . . 4×2, 4×3, 4×5, 4×6, . . . etc.) and all such array sizes are within the scope of the embodiments. However, any suitable array size may be used.

Figure 2:
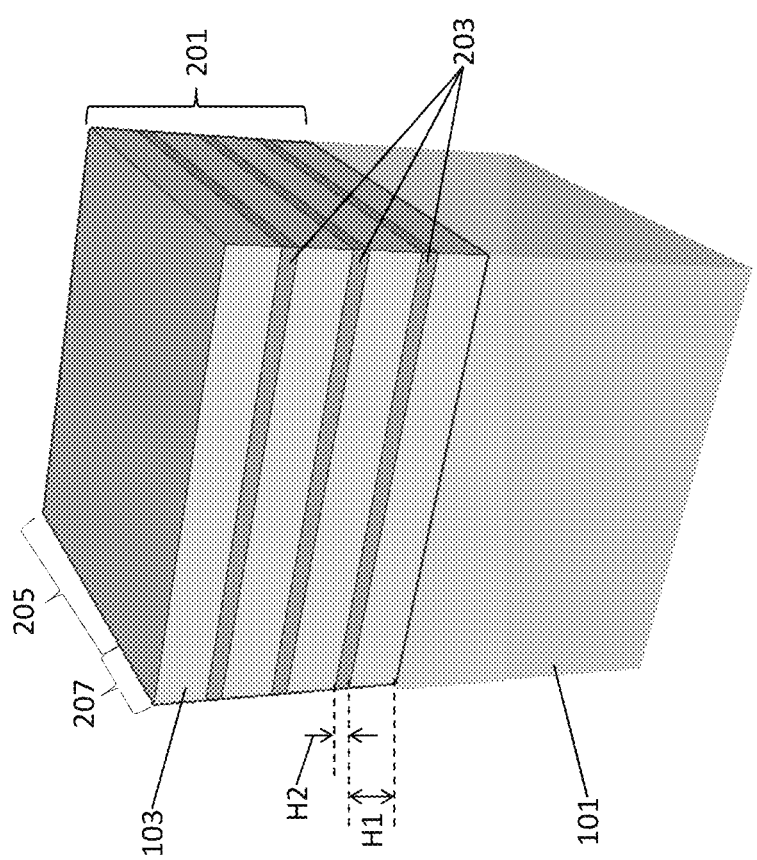
FIGS. 2-12C illustrate intermediate stages in the formation of the 3D NOR memory array, in accordance with some embodiments.

FIG. 2 illustrates forming a multi-layer stack 201 over a substrate 101, in accordance with some embodiments. The substrate 101 may be a semiconductor substrate, such as a bulk semiconductor, a semiconductor-on-insulator (SOI) substrate, or the like, which may be doped (e.g., with a p-type or an n-type dopant) or undoped. The substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 101 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The multi-layer stack 201 is formed over the substrate 101. The multi-layer stack 201 includes alternating layers of isolation layers 103 and dummy layers 203. The isolation layers 103 may be referred to as "first layers of the multi-layer stack 201" and the dummy layers 203 may be referred to as "second layers of the multi-layer stack 201." The isolation layers 103 and the dummy layers 203 may be dielectric materials or semiconductor materials (e.g., an oxide such as silicon oxide, SiN, Si, SiGe, or the like). The material of the dummy layers 203 is different from the material of the isolation layers 103. According to a particular embodiment, the isolation layers 103 may be a first material (e.g., silicon oxide) and the dummy layers 203 may be a second material (e.g., SiN). The isolation layers 103 and the dummy layers 203 may be formed using, for example, chemical vapor deposition (CVD), atomic layer deposition (ALD), physical vapor deposition (PVD), or the like.

The multi-layer stack 201 may be formed by initially depositing a first one of the isolation layers 103 over the substrate 101. According to an embodiment, the isolation layers 103 may be formed by depositing a bulk layer (e.g., an oxide) using a CVD process or an ALD process. However, any suitable material and/or suitable deposition process may be used. Once deposited, an optional anneal process (e.g., rapid thermal anneal, oxidation densification, or the like) and/or an optional planarization process (e.g., chemical mechanical planarization) may be performed to harden and/or planarize the first one of the isolation layers 103. According to some embodiments, the isolation layers 103 may be formed to a first height H1 of between about 10 nm and about 100 nm. However, any suitable height may be used.

Once the first one of the isolation layers 103 has been formed, a first one of the dummy layers 203 may be formed over the first one of the isolation layers 103. According to an embodiment, the dummy layers 203 may be formed by depositing a bulk layer (e.g., SiN) using, for example, an ALD process or a CVD process. However, any suitable material and/or suitable deposition process may be utilized. Once deposited, an optional anneal process (e.g., a rapid thermal anneal (RTA), oxidation densification, or the like) and/or an optional planarization process (e.g., chemical mechanical planarization) may be performed to harden and/or planarize the first one of the dummy layers 203. According to some embodiments, the dummy layers 203 may be formed to a second height H2 of between about 10 nm and about 100 nm. However, any suitable height may be used. According to some embodiments, a ratio of the first height H1 of the isolation layers 103 to the second height H2 of the dummy layers 203 may be between about 0.1:1 and about 10:1. However, any suitable ratio may be utilized.

Once the first one of the dummy layers 203 has been formed, further isolation layers 103 and further dummy layers 203 may be formed in the multi-layer stack 201 in an alternating fashion one over the other until a desired topmost layer of the dummy layers 203 and a topmost layer of the isolation layers 103 have been formed. Any suitable number of isolation layers 103 and any suitable number of dummy layers 203 may be formed in the multi-layer stack 201. In the illustrated embodiment, four of the isolation layers 103 and three of the dummy layers 203 are formed in the multi-layer stack 201.

FIG. 2 further illustrates a first region 205 of the multi-layer stack 201. The first region 205 may be designated for forming the 3D memory array 100, according to some embodiments. In addition, a second region 207 of the multi-layer stack 201 is adjacent the first region 205 and may be designated for forming connectors to the 3D memory array 100, in accordance with some embodiments.

Figure 3:
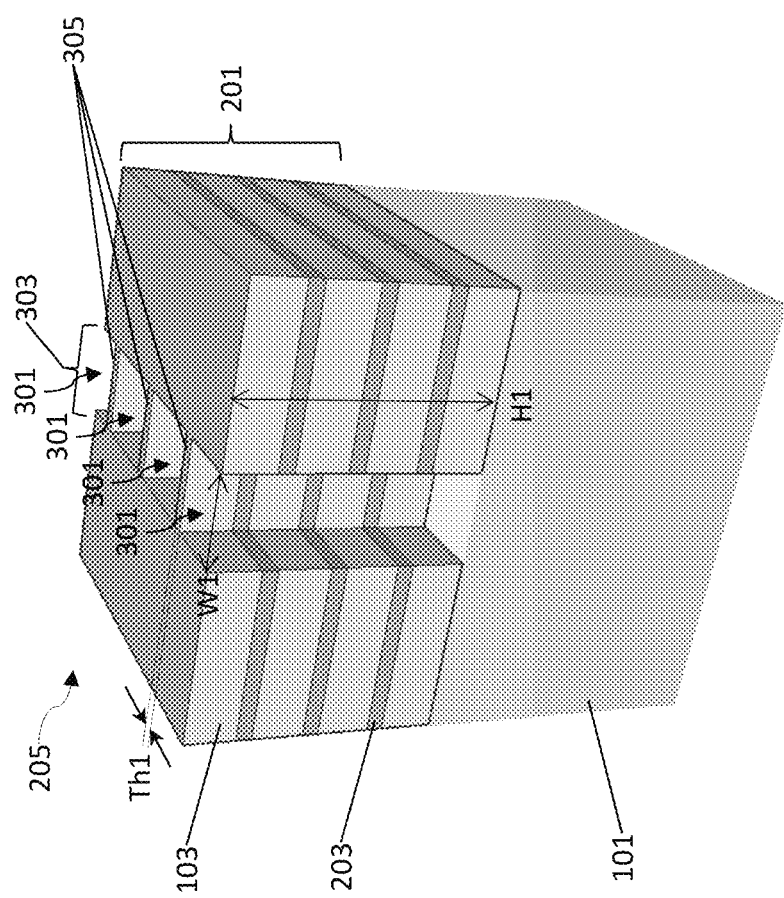

Turning to FIG. 3, this figure illustrates the formation of gate trenches 301 within a channel region 303 of the multi-layer stack 201, according to some embodiments. The channel region 303 may also be referred to herein as a word line region. The gate trenches 301 may be formed by initially forming a photoresist (not shown) over the multi-layer stack 201. The photoresist may be formed using a spin-on technique and can be patterned using acceptable photolithography techniques. The photoresist may be patterned to expose the surface of the topmost layer of the multi-layer stack 201 in desired locations of the gate trenches 301. The gate trenches 301 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over multi-layer stack 201 and patterned using a photolithography process. Spacers are formed alongside the patterned sacrificial layer using a self-aligned process, and the sacrificial layer may be removed.

Once formed, the spacers may be used as a mask to etch the materials of the isolation layers 103 and the materials of the dummy layers 203 exposed through the mask. The etching may be one or more of any acceptable etch processes, such as by wet or dry etching, a reactive ion etch (RIE), neutral beam etch (NBE), the like, or a combination thereof. The etching may be anisotropic. In some embodiments, the mask may be used with multiple separate etching processes to remove exposed materials of the isolation layers 103 and to remove exposed materials of the dummy layers 203. However, the mask may also be used with a single etching process to etch through both of the materials of the isolation layers 103 and the dummy layers 203.

According to some embodiments, a first etch chemical that is selective to the isolation layers 103 and relatively non-selective to the dummy layers 203 may be used to form the gate trenches 301 through the isolation layers 103 and stopping on the dummy layers 203. A second etch chemical that is selective to the dummy layers 203 and relatively non-selective to the isolation layers 103 may be used to form the gate trenches 301 through the dummy layers 203 and stopping on the isolation layers 103. In other embodiments, a single etching process may be used to remove both materials of the isolation layers 103 and the dummy layers 203, such as with an etching process that is selective to the multi-layer stack 201 (e.g., etches the materials of the isolation layers 103 and the dummy layers 203 at a faster rate than the material of the substrate 101). In embodiments where the substrate 101 is formed of silicon carbide (SiC), the isolation layers 103 are formed of oxide (silicon oxide), and the dummy layers 203 are formed of silicon nitride (SiN), the gate trenches 301 can be formed by a dry etch using a fluorine-based gas (e.g., $C_4F_6$) mixed with hydrogen ($H_2$) or oxygen ($O_2$) gas.

According to some embodiments, timed etch processes may be used to stop the etching of the gate trenches 301 after the trenches have reach a desired depth. For example, the timed etch process may be timed to stop at the surface of the substrate 101, although the timed etch process may be timed to etch into the substrate 101 to a desired depth. According to some embodiments, an optional contact etch stop layer (not shown) may be provided at an interface between the substrate 101 and the multi-layer stack 201. The optional contact etch stop layer may comprise a dielectric material, such as, silicon nitride, silicon oxide, silicon oxynitride, or the like, having a different etch rate than the materials of an overlying layer of the multi-layer stack 201. In such embodiments, the optional contact etch stop layer is formed via a suitable deposition process (e.g., atomic layer deposition, chemical vapor deposition, physical vapor deposition, or the like) over the substrate 101 prior to the formation of the multi-layer stack 201 and the multi-layer stack 201 is formed over the optional contact etch stop layer. Furthermore, an additional etch process may be used to remove materials of the optional contact etch stop layer such that the substrate 101 is exposed at the bottom of the gate trenches 301.

Once patterned, the remaining portions of the multi-layer stack 201 between the gate trenches 301 form a plurality of fins 305. As such, the gate trenches 301 are separated by the fins 305. According to some embodiments, the gate trenches 301 may be formed to a first width W1 of between about 50 nm and about 500 nm and a first height H1 of between about 500 nm and about 5,000 nm and the fins 305 may be formed to a first thickness Th1 of between about 5 nm and about 30 nm. However, any suitable width, height and thickness may be used. As such, the gate trenches 301 are formed to an aspect ratio of between about 10:1 and about 50:1, in accordance with some embodiments. However, any suitable aspect ratio may be used.

Although the embodiment illustrated in FIG. 3 shows each of the fins 305 having the same width, widths of the fins 305 of the memory array 100 located in one region of the multi-layer stack 201 may be greater or thinner than the fins 305 of another memory array 100 located in another region of the multi-layer stack 201. Further, while each of the gate trenches 301 are illustrated as having a consistent width throughout, according to some embodiments. In other embodiments, the gate trenches 301 and thus the fins 305 may have tapered sidewalls such that a width of each of the fins 305 continuously increases in a direction towards the substrate 101. In such embodiments, each of the isolation layers 103 and the dummy layers 203 may have a different width in a direction perpendicular to the sidewalls of the fins 305.

Figure 4:
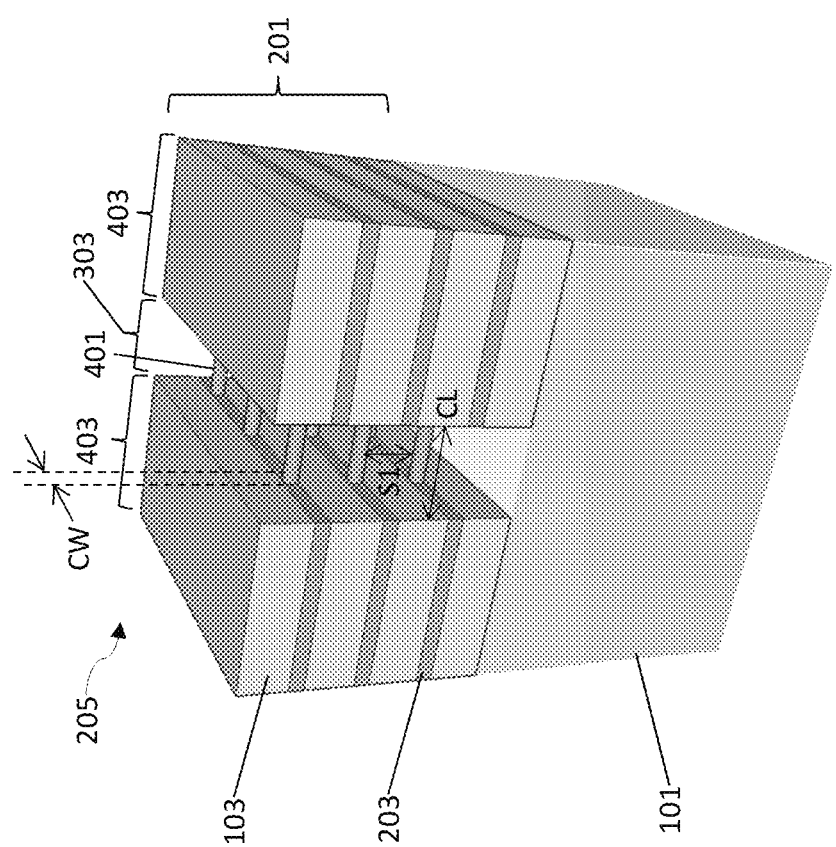

FIG. 4 illustrates a wire-release process for forming dummy nanostructures 401 from the dummy layers 203. Once the gate trenches 301 have been formed, according to some embodiments, the spacers and/or photoresist used to form the gate trenches 301 in FIG. 3 may be removed and a mask layer (not shown) for use in the wire-release process may be formed over the multi-layer stack 201 and patterned to expose the channel region 303. In other embodiments, the spacers and/or photoresist layer used to form the gate trenches 301 may be retained and the mask layer for use in the wire-release process is formed over the spacers and the photoresist layer. In such embodiments, the mask layer may be formed over the photoresist and/or the spacers and then patterned to expose the portions of the photoresist and/or the spacers covering the gate trenches 301 and/or the fins 305 in the channel region.

According to some embodiments, the mask layer may be a conductive or non-conductive material and may be selected from a group including silicon nitride, silicon oxynitride, amorphous silicon, polycrystalline-silicon (poly-silicon), poly-crystalline silicon-germanium (poly-SiGe), metallic nitrides, metallic silicides, metallic oxides, and metals. The mask layer may be deposited by physical vapor deposition (PVD), CVD, ALD, sputter deposition, or other techniques for depositing the selected material. Once the material of the mask layer has been deposited, the material may be patterned using, e.g., a photolithographic masking and etching process. Once the mask layer is patterned, the exposed portions of the photoresist and/or the spacers are removed using one or more suitable removal processes (e.g., ashing, selective etching, combinations, or the like).

Once the mask layer has been formed and patterned, the sidewalls of the gate trenches 301 and thus the sidewalls of the fins 305 are exposed. As such, the material of the isolation layers 103 of the fins 305 may be removed from between the substrate 101 and the dummy layers 203 in a wire release process step. As such, the remaining material of fins 305 (e.g., the dummy layers 203) form an array of dummy nanostructures 401 between source/bit line regions 403 of the multi-layer stack 201. The wire release process step may also be referred to as a sheet release process step, a sheet formation process step, a nanosheet formation process step or a wire formation process step. The dummy nanostructures 401 may be referred to herein as dummy wires, dummy nanowires, dummy sheets, or dummy nanosheets. In an embodiment, the isolation layers 103 of the fins 305 may be removed using a wet etching process that selectively removes the material of the isolation layers 103 (e.g., silicon oxide) without significantly removing the materials of the substrate 101 and the material of the dummy nanostructures 401 (e.g., silicon nitride (SiN)) within the channel region 303 and without significantly removing the materials of the isolation layers 103 and the material of the dummy layers 203 (e.g., silicon nitride (SiN)) of the source/bit line regions 403 of the multi-layer stack 201. However, any suitable removal process may be utilized.

For example, in an embodiment, an etch chemical containing phosphorous (e.g., $H_3PO_4$) may be used to selectively remove the material of the isolation layers 103 (e.g., OX) without substantively removing the material of the dummy nanostructures 401 (e.g., SiN) and/or the material of the substrate 101 (e.g., SiC). Additionally, the wet etching process may be performed at a temperature of between about 20° C. and about 150° C., and for a time of between about 10 seconds and about 300 seconds. However, any suitable etchant, process parameters, and time can be utilized.

By removing the material of the isolation layers 103, the sides of the dummy nanostructures 401 are exposed and separated from each other within the channel region 303. According to some embodiments, the dummy nanostructures 401 are separated by a first spacing Si of between about 5 nm and about 15 nm. However, any suitable spacing may be used. The dummy nanostructures 401 form a dummy channel structure between opposite ones of the source/bit line regions 403 and have a channel length (CL) of between about 5 nm and about 180 nm. The dummy nanostructures 401 may be formed to have a channel width (CW) of between about 8 nm and about 100 nm. In some embodiments, a tuning selectivity of the etching process may be adjusted such that the dummy nanostructures 401 are formed with smooth surfaces or facet-limited surfaces. As such, the dummy nanostructures 401 may be formed with different profile shapes (e.g., round, square, rectangle, hexagon, octagon, or the like). In the illustrated embodiment, the dummy nanostructures 401 are formed to have a round profile with the channel width CW being about the same as the original thicknesses of the dummy layers 203 such as, of between about 3 nm and about 15 nm, although the etching processes may also be utilized to reduce the thicknesses.

Once the dummy nanostructures 401 have been formed, any remaining portions of the mask layer, the retained spacers and/or the retained photoresist may be removed using one or more suitable removal processes (e.g., wet etch, dry etch, or the like) that utilize one or more etchants that are selective to the materials of the mask layer, the retained spacers and/or the retained photoresist. However, any suitable removal process may be utilized.

Figure 5:
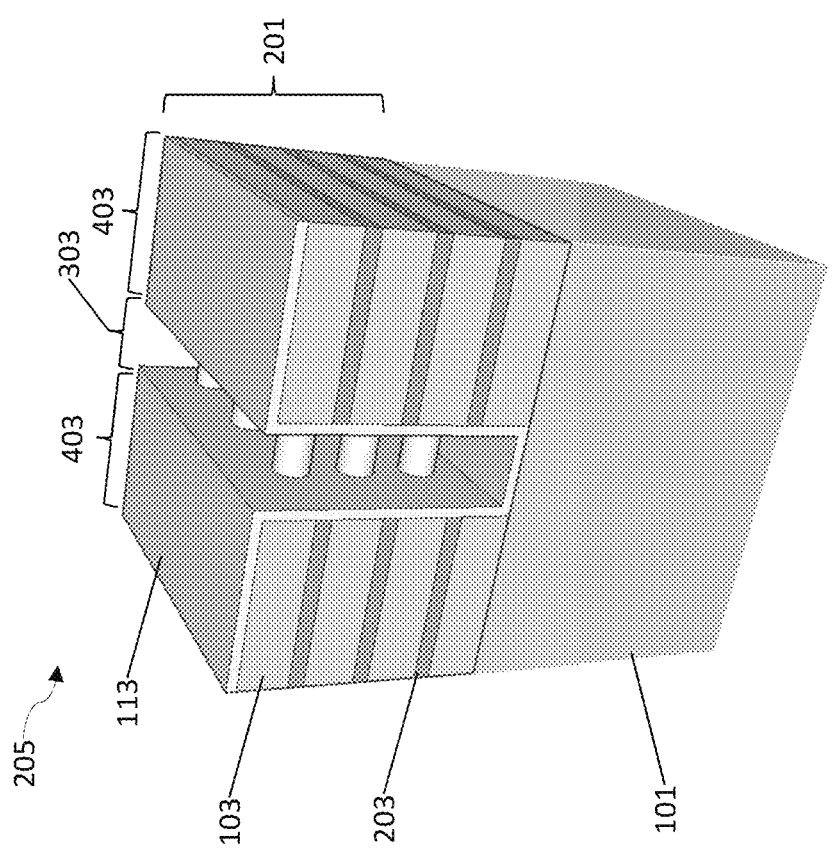

Continuing to FIG. 5, this figure illustrates the formation of the semiconductor layer 113. The semiconductor layer 113 is formed as a conformal thin film of an acceptable semiconductor material for providing wrap-around channel regions over the exposed surfaces of the dummy nano structures 401 and along sidewalls and top surfaces of the source/bit line regions 403. As such, the semiconductor layer 113 wraps around and adopts the profile shape (e.g., round) of the dummy nanostructures 401. According to some embodiments, the semiconductor layer 113 may be a thin film layer of material such as zinc oxide (ZnO), indium gallium zinc oxide (IGZO), indium tungsten oxide (IWO), indium tin oxide (ITO), indium gallium zinc tin oxide (IGZTO), other metal oxides, polysilicon, amorphous silicon, or the like. A thickness of the semiconductor layer 113 can be between about 5 nm and about 20 nm. However, any suitable thickness may be used. Furthermore, the semiconductor layer 113 may be formed by an acceptable deposition process such as ALD, CVD, PVD, or the like. However, any suitable materials and deposition processes may be utilized to form the semiconductor layer 113.

Figure 6:
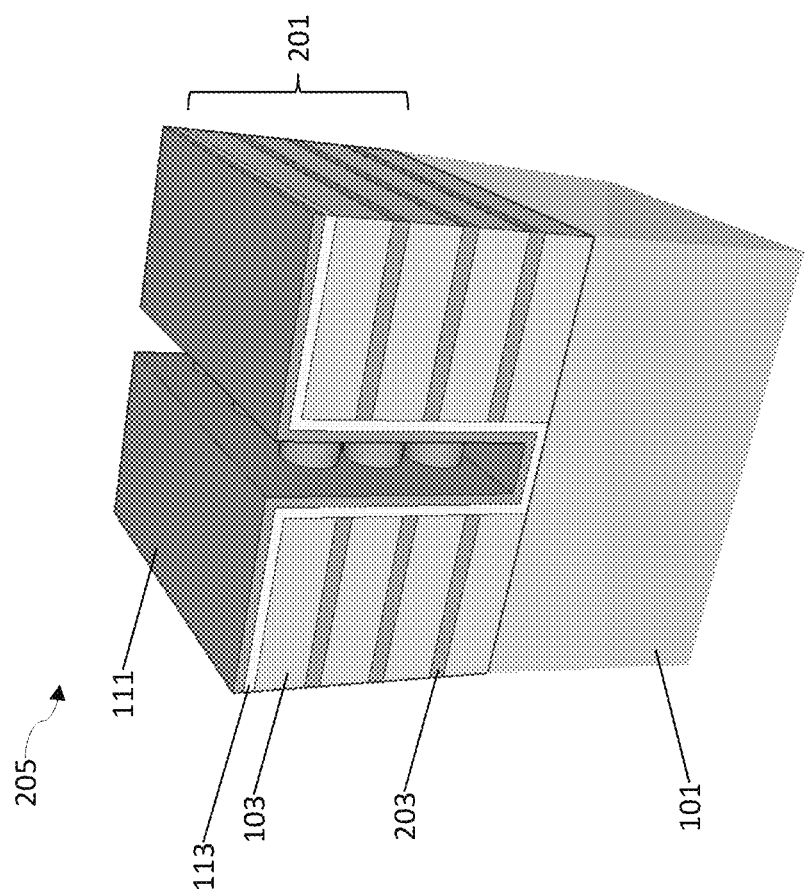

With reference now to FIG. 6, this figure illustrates the formation of the memory film 111 over the semiconductor layer 113. The memory film 111 is formed as a conformal thin film over the exposed surfaces of the semiconductor layer 113. According to some embodiments, the memory film 111 may be formed using one or more layers of acceptable dielectric materials suitable for storing digital values, such as multilayer dielectrics (e.g., oxide-nitride-oxide (ONO), nitride-oxide-nitride (NON), or the like); other dielectrics (e.g., silicon oxynitride (SiON), silicon nitride (SiN), or the like); ferro-electric (FE) materials such as, hafnium zirconium oxide (HfZrO); zirconium oxide (ZrO); undoped hafnium oxide (HfO); doped hafnium oxides (e.g., HfLaO using lanthanum (La) as a dopant, HfSiO using silicon (Si) as a dopant, HfAlO using aluminum (Al) as a dopant, or the like); combinations; or the like. A thickness of the memory film 111 can be in the range of about 5 nm to about 30 nm. The material of the memory film 111 may be formed by an acceptable deposition process such as atomic layer deposition, chemical vapor deposition, physical vapor deposition, or the like.

Figure 7:
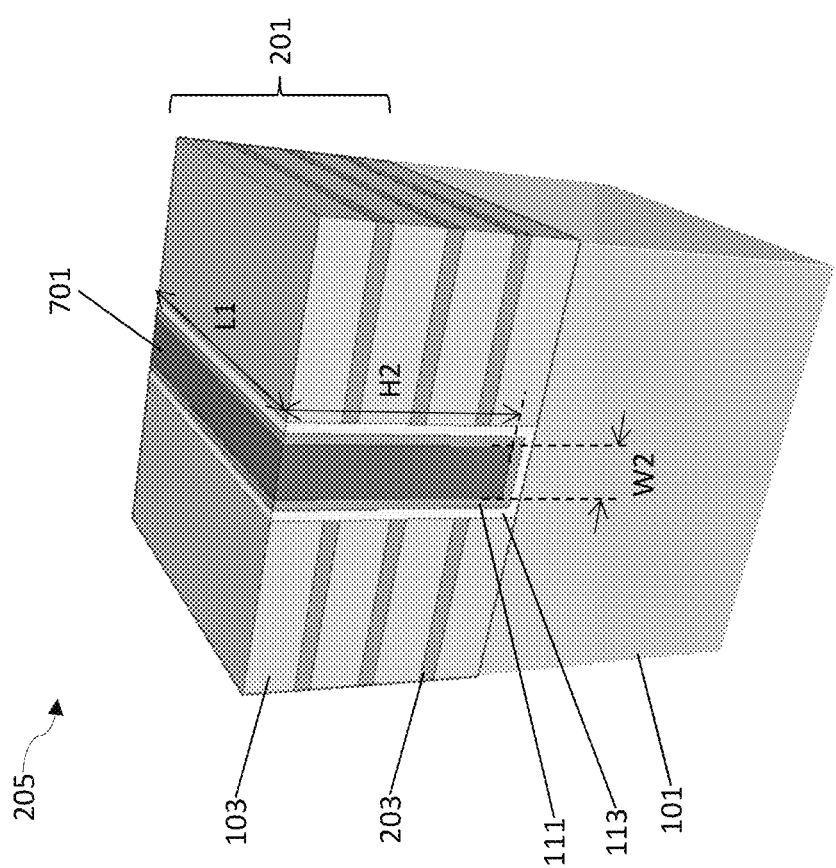

FIG. 7 illustrates the formation of a wrap-around word line structure 701 formed over the memory film 111 and a subsequent chemical mechanical planarization. The wrap-around word line structure 701 may comprise one or more layers, such as glue layers, barrier layers, diffusion layers, and fill layers, and the like. The wrap-around word line structure 701 may be referred to herein as a conductive wrap-around structure, a word line stack, or a word line electrode. In some embodiments, the wrap-around word line structure 701 includes a glue layer and a conductive layer. The glue layer may be formed of metal nitride, such as titanium nitride, tantalum nitride, zirconium nitride, hafnium nitride, or the like. The conductive layer may be formed of a metal such as tungsten, cobalt, aluminum, nickel, copper, silver, gold, alloys thereof, or the like. The material of the glue layer is one that has good adhesion to the material of the memory film 111 and the material of the conductive layer is one that has good adhesion to the material of the glue layer. In embodiments where the memory film 111 is formed of an oxide such as oxide-nitride-oxide (ONO) film, the glue layer can be titanium nitride and the conductive layer can be tungsten. The glue layer and conductive layer may each be formed by an acceptable deposition process such as atomic layer deposition (ALD), chemical vapor deposition (CVD), or the like. The materials of the wrap-around word line structure 701 may fill and overfill the remaining opening in the channel region 303 and may be formed over the top surfaces of the memory film 111 outside of the channel region 303. The glue layer can have a thickness in the range of about 1 nm to about 10 nm. The conductive layer fills the remaining area of the gate trenches 301 and can have a thickness in the range of about 15 nm to about 200 nm. Once deposited, the materials of the wrap-around word line structure 701, the memory film 111 and the semiconductor layer 113 may be planarized with the topmost layer of the isolation layers 103 using a process such as chemical mechanical planarization, an etch back process, combinations thereof, or the like.

According to some embodiments, the wrap-around word line structure 701 may be formed with a second height H2 of between about 500 nm and about 5,000 nm and a second width W2 of between about 30 nm and about 400 nm. However, any suitable height and width may be used. In some embodiments, the wrap-around word line structure 701 may be formed with a first length L1 of between about 1,000 nm and about 100,000 nm. The aspect ratio (AR) of the wrap-around word line structure 701 is the ratio of the second height H2 to the second width W2. In accordance with some embodiments, the wrap-around word line structure 701 is formed with an aspect ratio between about 2.5:1 and about 200:1. However, any suitable aspect ratios may be used to form the wrap-around word line structure 701.

Figure 8:
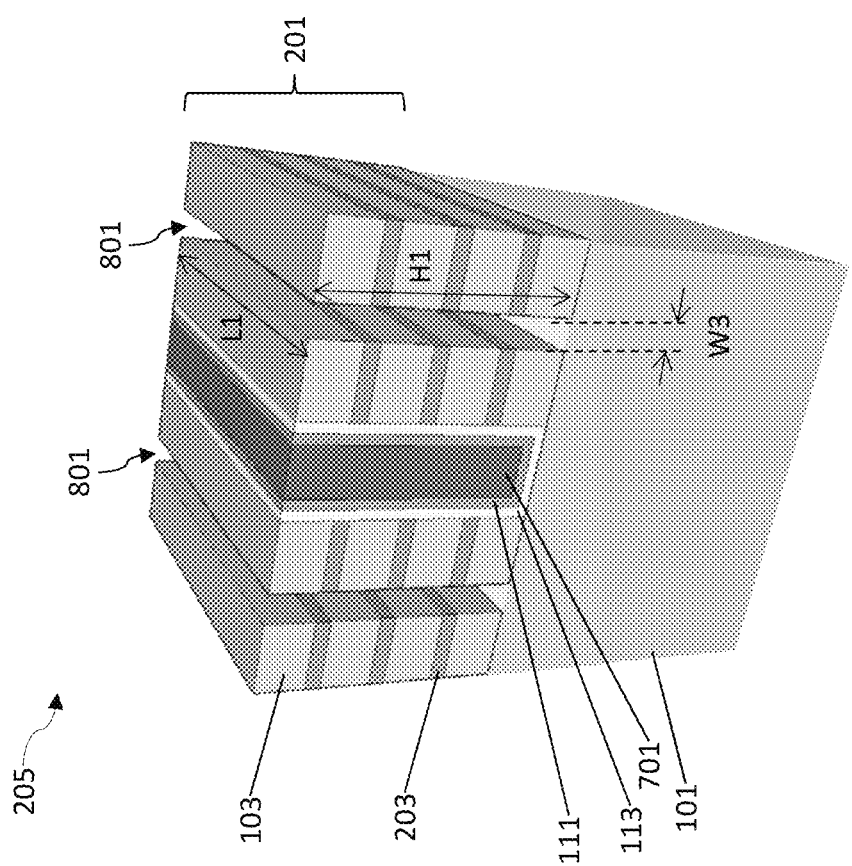

FIG. 8 illustrates the formation of array slits 801 in the multi-layer stack 201. The array slits 801 may be referred to herein as vertical slits, vertical trenches, or vertical array openings. In the illustrated embodiment, the array slits 801 extend through the multi-layer stack 201 and expose the substrate 101. In another embodiment, the array slits 801 extend through some but not all layers of the multi-layer stack 201. The array slits 801 may be formed using any of the photolithography and anisotropic etching techniques suitable for forming the gate trenches 301, as set forth above. However, other suitable photolithography and etching techniques may also be used to form the array slits 801.

Forming the array slits 801 divides the multi-layer stack 201 and separates one region of the multi-layer stack 201 occupied by the intermediate structure of the 3D memory array 100 from adjacent regions of the multi-layer stack 201. In some embodiments, the adjacent regions of the multi-layer stack 201 may also be occupied by intermediate structures similar to that of the 3D memory array 100, although other structures may be also be formed in one or more of the adjacent regions. According to some embodiments, the array slits 801 may be formed with a third width W3 of between about 20 nm and about 200 nm. In some embodiments, the array slits 801 may be formed with a first length L1 of between about 1,000 nm and about 100,000 nm. The aspect ratio (AR) of each of the array slits 801 is the ratio of the first height H1 to the third width W3. The array slits 801 may be formed to have a same aspect ratio, although the array slits 801 may be formed to different aspect ratios. In accordance with some embodiment, the array slits 801 are formed with an aspect ratio between about 50:1 and about 100:1. However, any suitable aspect ratios may be used to form the array slits 801.

Figure 9A:
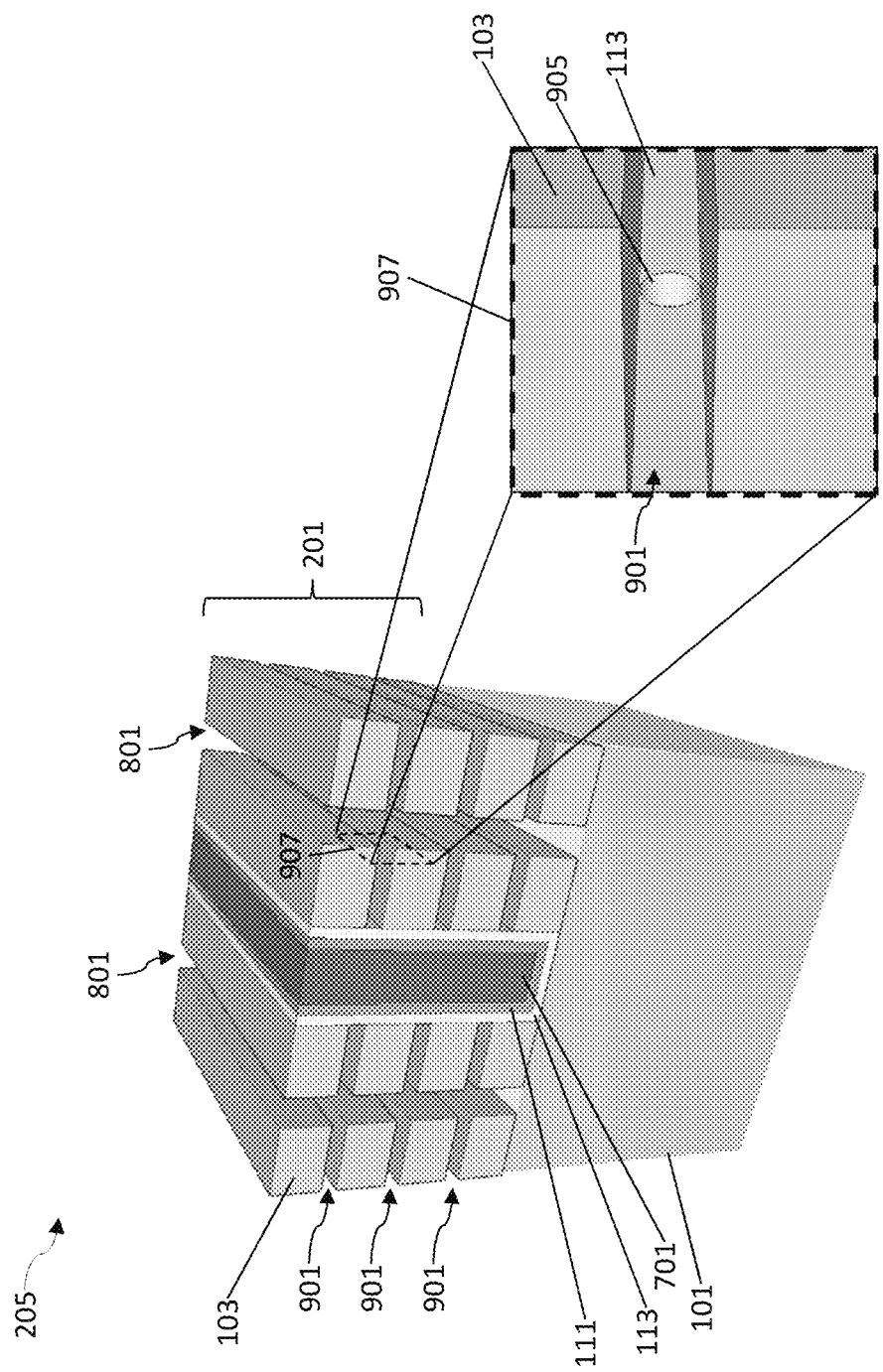
Figure 9B:
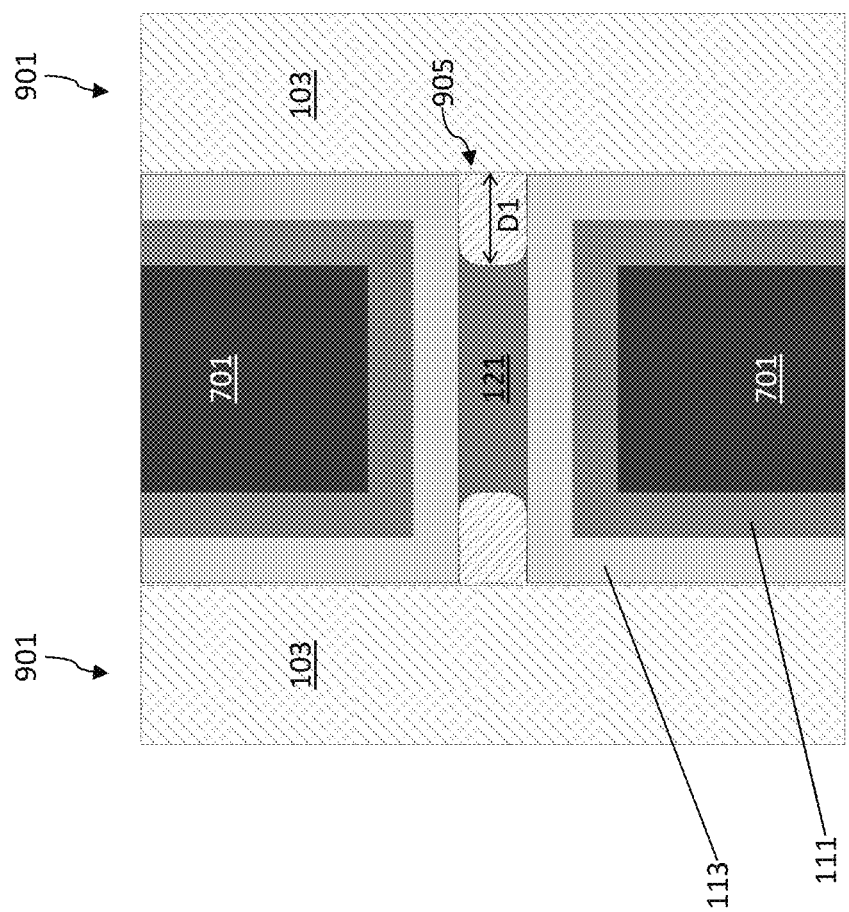

Turning to FIGS. 9A and 9B, these figures illustrate the formation of source/bit line gaps 901 in the multi-layer stack 201. Once the array slits 801 have been formed, the dummy layers 203 are exposed at the sidewalls of the array slits 801. As such, the source/bit line gaps 901 may be formed by any acceptable etching process, such as one that is selective to the material of the dummy layers 203 (e.g., selectively etches the material of the dummy layers 203 at a faster rate than the materials of the isolation layers 103, the semiconductor layer 113 and the substrate 101). In embodiments where the substrate 101 is formed of silicon carbide (SiC), the semiconductor layer 113 is formed of zinc oxide (ZnO), the isolation layers 103 are formed of oxide (OX), and the dummy layers 203 are formed of silicon nitride (SiN), the source/bit line gaps 901 can be formed by a wet etch using an etch chemical comprising an acid and an oxidizer. For example, the etch chemical used may be a mixture of hydrochloric acid (HCl) and hydrogen peroxide ($H_2O_2$), where HCl functions as the acid and $H_2O_2$ functions as the oxidizer. In some embodiments, a mixing ratio (e.g., volume ratio) between HCl and $H_2O_2$ is between about 1:1 and 1:20 for the wet etch process. The wet etch process may be performed at a temperature between about 40° C. and about 70° C. for a duration between about 1 minute and about 5 minutes, or else may be ended using an endpoint detection process.

FIG. 9A further illustrates an area 907 of one of the array slits 801. The area 907 is highlighted with a dashed line and the area 907 is also illustrated in a magnified view in FIG. 9A. In the magnified view of the area 907, a sidewall of the semiconductor layer 113 can be seen through one of the source/bit line gaps 901 in between two of the isolation layers 103. A recess 905 in the dummy nanostructure 401 from the sidewall of the semiconductor layer 113 is also illustrated in the magnified view of the area 907 of FIG. 9A. According to some embodiments, the dummy nanostructures 401 may be recessed from the sidewall of the semiconductor layer 113 in a timed process of the removal of the dummy layers 203. In other embodiments, after the dummy layers 203 have been removed, the dummy nanostructures 401 may be recessed in a subsequent etching step using an etch chemical that is selective to the material of the dummy nanostructures 401 and non-selective to the materials of the semiconductor layer 113 and the substrate 101.

FIG. 9B is a top-down view of a cross section taken through the dummy nanostructure 401 (relabeled dummy channel core 121 in FIG. 9B). FIG. 9B illustrates the isolation layers 103 in phantom to indicate that the level of the isolation layers 103 are below a level of the dummy channel core 121. In particular, FIG. 9B illustrates the semiconductor layer 113 between two of the source/bit line gaps 901, the semiconductor layer 113 surrounding and being wrapped around the dummy nanostructure 401, the memory film 111 over and surrounding the semiconductor layer 113 and the wrap-around word line structure 701 over and surrounding the memory film 111. FIG. 9B further illustrates the recesses 905 in the dummy channel core 121. In some embodiments, the etching process is a timed process used to form the recesses 905 in the dummy material of the dummy channel core 121 to a first depth D1. According to some embodiments, the first depth D1 may be between about 1 nm and about 20 nm. However, any suitable depth may be used. Furthermore, a tuning selectivity of the etching process may be adjusted to shape the distal ends of the dummy channel core 121 to a desired shape (e.g., concave, convex, flat, round, facet-limited, or the like). In the illustrated embodiment, the distal ends of the dummy channel core 121 are concave.

Figure 10:
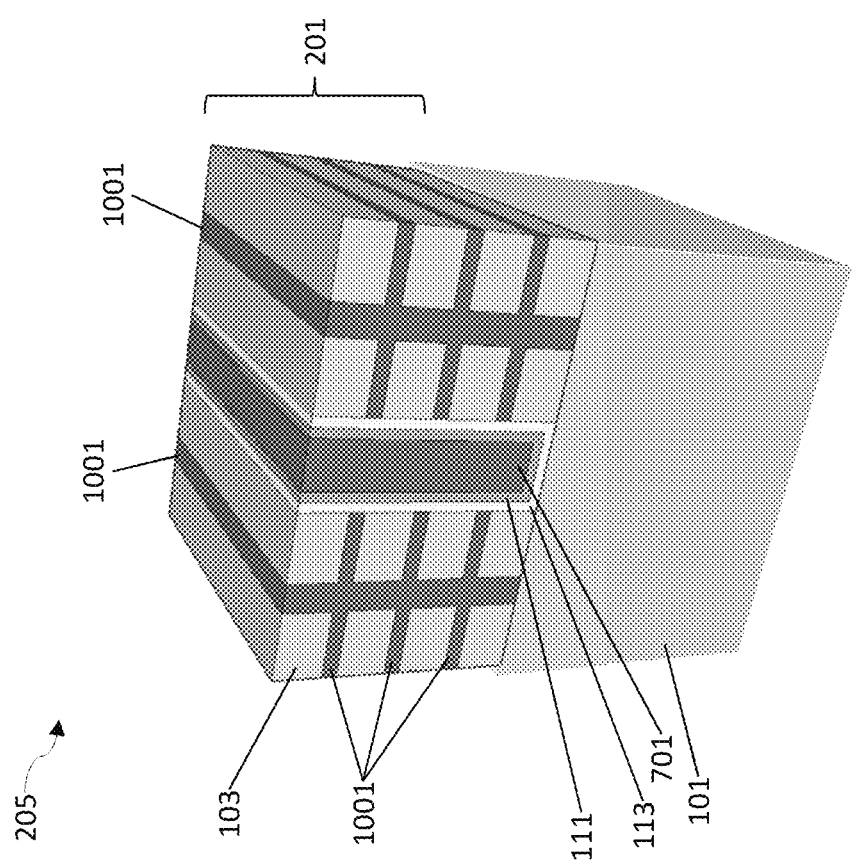

Continuing to FIG. 10, this figure illustrates the formation of a metal fill material 1001 in the array slits 801 (see, e.g., FIG. 8) and the source/bit line gaps 901 (see, e.g., FIG. 9). The metal fill material 1001 may comprise one or more layers, such as glue layers, barrier layers, diffusion layers, and fill layers, and the like and may be formed using any of the materials and processes suitable for forming the wrap-around word line structure 701. For example, the materials used to form the metal fill material 1001 may be the same as the materials used to form the wrap-around word line structure 701, although they may be different. In some embodiments, the metal fill material 1001 includes a glue layer and a conductive layer. The glue layer may be formed of a metal nitride suitable for forming the wrap-around word line structure 701 (e.g., titanium nitride, tantalum nitride, zirconium nitride, hafnium nitride, or the like). The conductive layer may be formed of a metal suitable for forming the wrap-around word line structure 701 (e.g., tungsten (W), titanium (Ti), titanium nitride (TiN), tantalum nitride (TaN), or the like). The material of the glue layer is one that has good adhesion to the material of the isolation layers 103 and/or the semiconductor layer 113 and the material of the conductive layer is one that has good adhesion to the material of the glue layer.

In embodiments where the isolation layers 103 and/or the semiconductor layer 113 is formed of an oxide such as zinc oxide (ZnO), the glue layer can be formed of titanium nitride (TiN) and the conductive layer can be formed of tungsten (W). The glue layer and conductive layer may each be formed by an acceptable deposition process such as atomic layer deposition, chemical vapor deposition, or the like. The materials of the metal fill material 1001 may be formed to fill and overfill the array slits 801 and the source/bit line gaps 901 and may be formed over the top surfaces of the topmost layers of the isolation layers 103 outside of the array slits 801. The glue layer can have a thickness in the range of about 1 nm to about 10 nm. Once deposited, the materials of the metal fill material 1001 may be planarized with the topmost layers of the isolation layers 103, the memory film 111 and the semiconductor layer 113, and the wrap-around word line structure 701 using a process such as chemical mechanical planarization.

Figure 11:
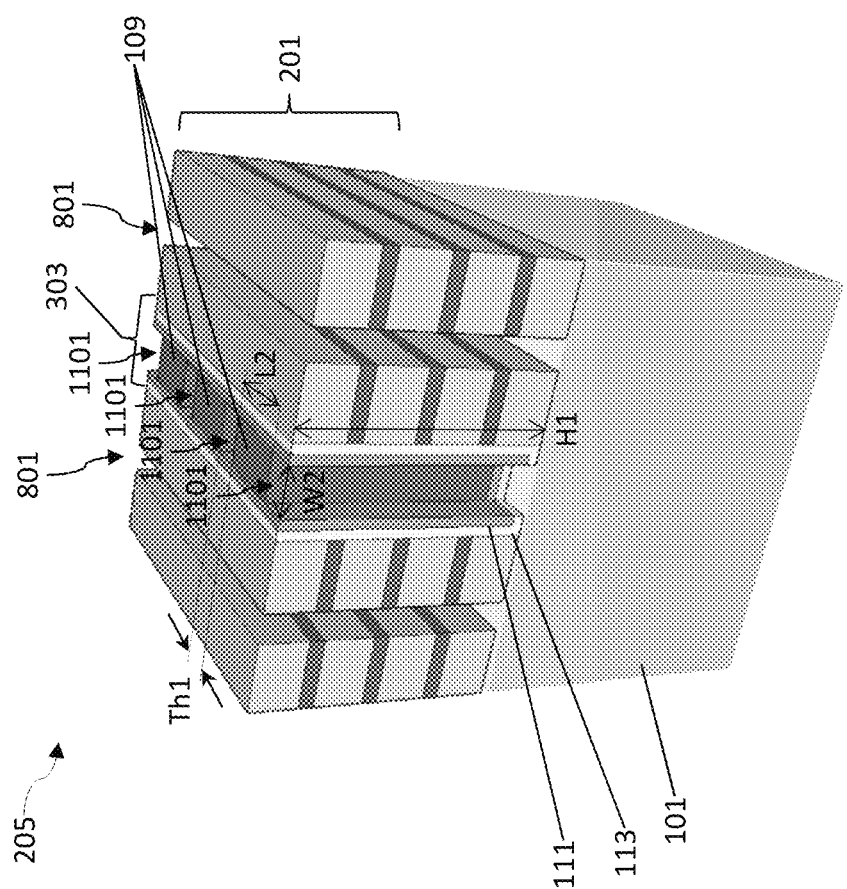

Turning to FIG. 11, this figure illustrates a formation of word line gaps 1101 and removal of the metal fill material 1001 from within the array slits 801 according to some embodiments. The word line gaps 1101 may be formed using any of the photolithography and etching techniques suitable for etching the materials of the wrap-around word line structure 701. The etching may be anisotropic. In embodiments where the conductive layer of the wrap-around word line structure 701 is tungsten (W) and the glue layer of the wrap-around word line structure 701 is titanium nitride (TiN), the memory film 111 is an oxide-nitride-oxide (ONO) film and the semiconductor layer 113 is zinc oxide (ZnO), the word line gaps 1101 can be formed and the array slits 801 can be re-exposed by a series of appropriate etches (e.g., dry etches and/or wet etches). According to some embodiments, a dry etch is performed using a fluorine-based gas (e.g., $C_4F_6$) mixed with hydrogen ($H_2$) or oxygen ($O_2$) gas is used to remove the conductive layer of the wrap-around word line structure 701 and a wet etch is performed using a nitric acid ($HNO_3$) and hydrofluoric acid (HF) solution to remove the glue layer of the wrap-around word line structure 701. However, other suitable removal processes may be utilized to remove the materials from the word line gaps 1101 and to re-expose the array slits 801. According to some embodiments, the word line gaps 1101 may be formed to the first height H1 such that the substrate 101 is exposed at a bottom of the word line gaps 1101. In some embodiments, the word line gaps 1101 may be formed beyond the first height H1 and are etched into the substrate 101 to a desired depth.

Forming the word line gaps 1101 divides the wrap-around word line structure 701 into the word lines 109, according to some embodiments. The word lines 109 may be formed with a second length L2, the second width W2, and the first height H1. According to some embodiments, the second length L2 may be a distance of between about 30 nm and about 100 nm. In some embodiments, the array slits 801 may be formed with a first length L1 of between about 1,000 nm and about 100,000 nm. However, any suitable dimensions may be utilized.

Figure 12A:
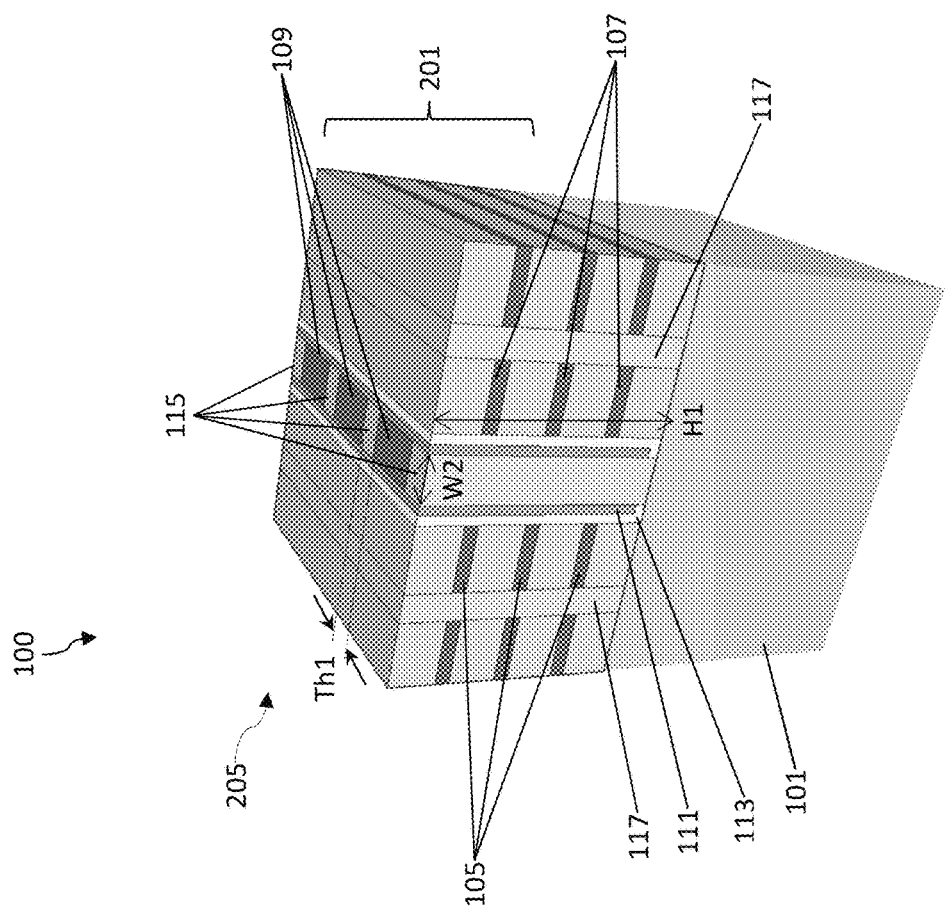
Figure 12B:
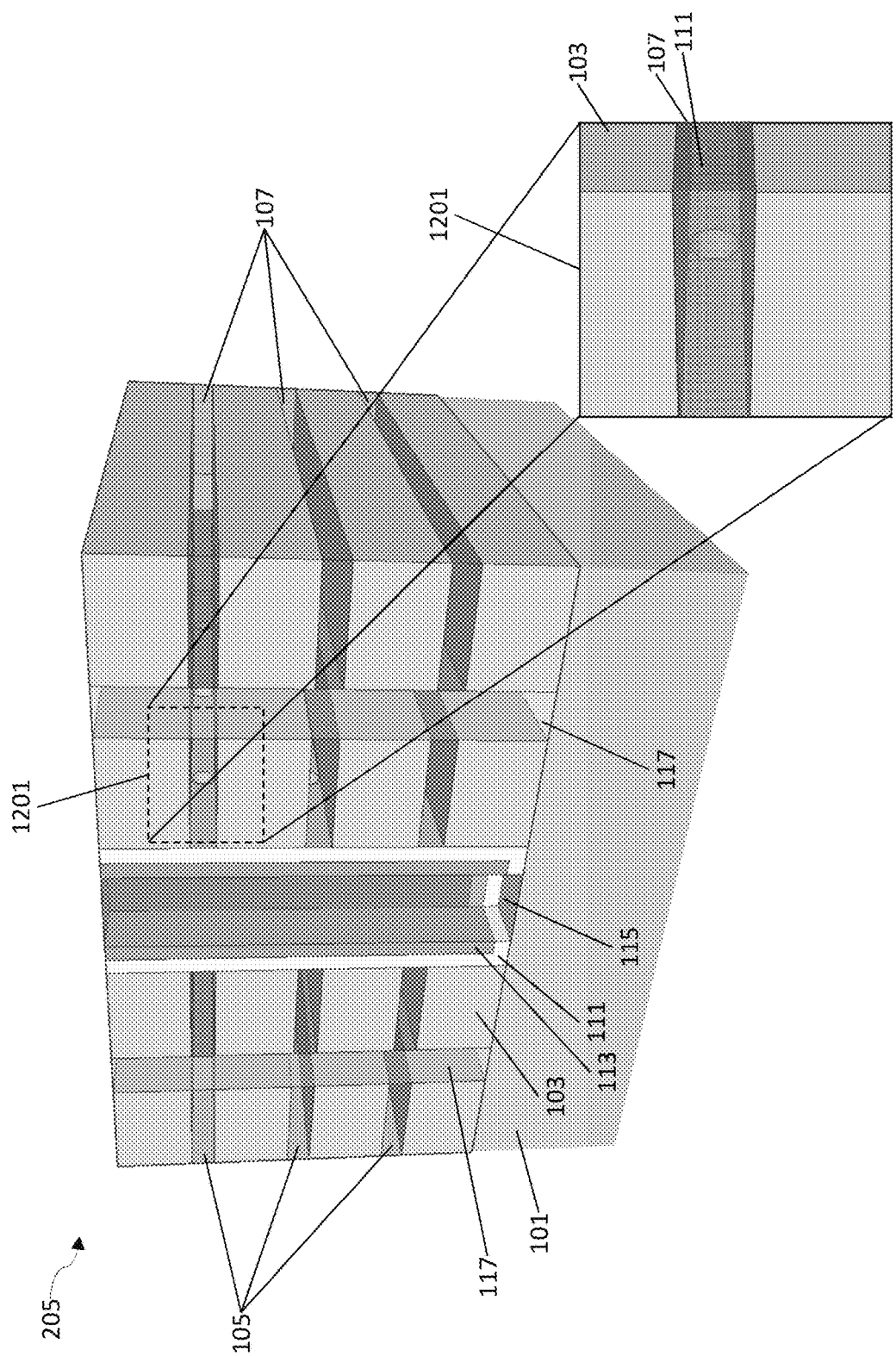
Figure 12C:
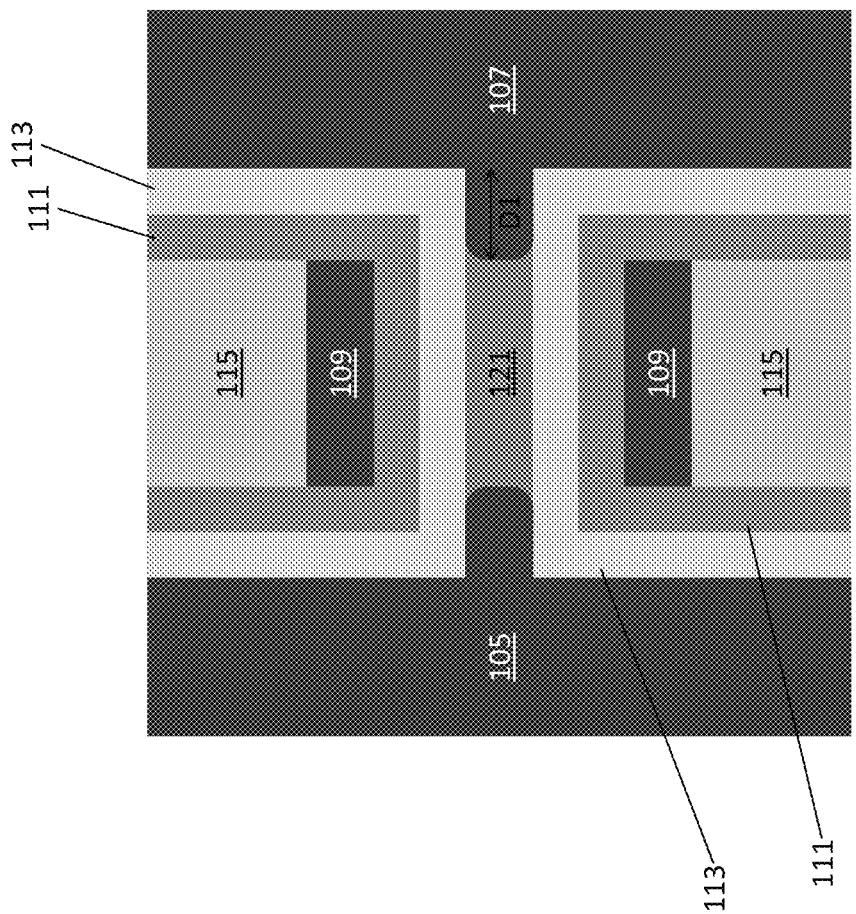

FIGS. 12A-12C illustrate the formation of the array spacers 117, the gate isolation plugs 115, the source lines 105, the bit lines 107, and the word lines 109 according to some embodiments. In particular, FIG. 12A illustrates the 3D memory array 100 in a perspective view with the gate isolation plugs 115 and the array spacers 117 formed in the word line gaps 1101 and the array slits 801 of FIG. 11. FIG. 12B illustrates the 3D memory array 100 in another perspective view with the source lines 105, the bit lines 107, the gate isolation plugs 115 and the array spacers 117 illustrated in phantom view to show the interface between the semiconductor layer 113 and the gate isolation plugs 115 internal to the 3D memory array 100. FIG. 12B further illustrates a magnified view of a second area 1201 to show details of the interface. FIG. 12C illustrates a top down view of the cross-section taken through the dummy channel core 121.

The array spacers 117 and the gate isolation plugs 115 are formed of dielectric materials. Acceptable dielectric materials include, but are not limited to oxides such as silicon oxide; nitrides such as silicon nitride; carbides such as silicon carbide; the like; or combinations thereof such as silicon oxynitride, silicon oxycarbide, silicon carbonitride, or the like. In some embodiments, the array spacers 117 and the gate isolation plugs 115 are formed using the same materials and a same deposition process. According to some embodiments, the gate isolation plugs 115 may be formed to the first thickness Th1, the second width W2, and the first height H1. The material of the gate isolation plugs 115 and the array spacers 117 may be formed by an acceptable deposition process such as ALD, CVD, flowable CVD (FCVD), or the like to fill and/or overfill the word line gaps 1101 and array slits 801, respectively.

In other embodiments, the materials used to form the gate isolation plugs 115 may be different from the materials used to form the array spacers 117. In such embodiments, separate removal processes may be used to re-expose the array slits 801 and to form the word line gaps 1101. Furthermore, separate deposition processes may be used to form the gate isolation plugs 115 and the array spacers 117. Furthermore, the array spacers 117 may be formed before the gate isolation plugs 115, although the array spacers 117 may be formed after the gate isolation plugs 115. All such removal processes, deposition processes, and ordering of such processes are within the scope of the embodiments.

Figure 13:
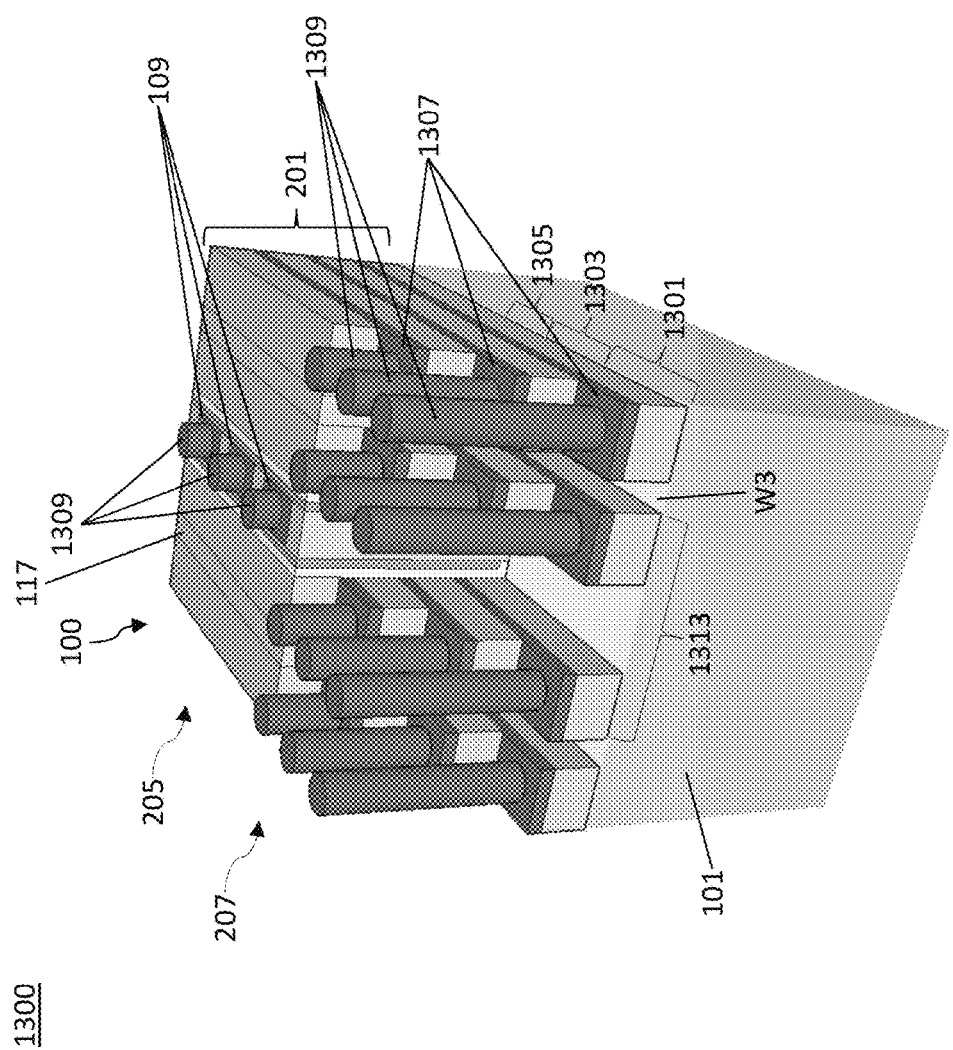
FIG. 13 illustrates a 3D NOR memory device with a staircase contact structure for external connection to the 3D NOR memory array, according to some embodiments.

FIG. 13 illustrates a first 3D-NOR memory device 1300, according to some embodiments. The first 3D-NOR memory device 1300 comprises a staircase contact structure 1313 formed within the second region 207 of the multi-layer stack 201 adjacent the 3D memory array 100 in accordance with some embodiments. The staircase contact structure 1313 may be formed by initially placing a photoresist (not shown) over the multi-layer stack 201. The photoresist can be formed by using a spin-on technique and can be patterned using acceptable photolithography techniques. Patterning the photoresist may expose a portion of the multi-layer stack 201 in a first staircase region 1301 while masking remaining portions of the multi-layer stack 201.

Once the first staircase region 1301 has been exposed, the exposed portions of the multi-layer stack 201 in the first staircase region 1301 are etched in a staircase etching process using the photoresist as a mask. The staircase etching process may be any acceptable etch process, such as by wet or dry etching, a reactive ion etch (RIE), neutral beam etch (NBE), the like, or a combination thereof. The etching may be anisotropic. The etching may remove portions of the topmost layers of the isolation layers 103 and the dummy layers 203 in the first staircase region 1301 such that the isolation layer 103 underlying the topmost layer of the dummy layers 203 is exposed in the first staircase region 1301. Because the topmost layers of the isolation layers 103 and the dummy layers 203 have different material compositions, etchants used to remove exposed portions of these layers may be different. In some embodiments, the dummy layers 203 act as etch stop layers while etching the overlying layer of the isolation layers 103. Once the topmost layers of the isolation layers 103 have been removed, the topmost layers of the dummy layers 203 are exposed in the first staircase region 1301. As such, the underlying isolation layers 103 act as etch stop layers while etching the overlying layer of the dummy layers 203. As a result, the portions of the topmost layers of the isolation layers 103 and the dummy layers 203 may be selectively removed without removing remaining layers of the multi-layer stack 201, and the pattern of the photoresist may be extended into the first staircase region 1301 of the multi-layer stack 201 to a desired depth. Alternatively, a timed etch processes may be used to stop the etching after reach a desired depth into first staircase region 1301 of the multi-layer stack 201. As such, the next layer of the isolation layers 103 underlying the topmost layer of the dummy layers 203 is exposed in the first staircase region 1301.

Once the next layer of the isolation layers 103 has been exposed, the photoresist may be trimmed to expose another portion of the multi-layer stack 201 in a second staircase region 1303 while masking remaining portions of the multi-layer stack 201 outside of the first staircase region 1301 and the second staircase region 1303. Once the second staircase region 1303 has been exposed, the exposed portions of the multi-layer stack 201 in the first staircase region 1301 and second staircase region 1303 are etched by repeating the staircase etching process using the trimmed photoresist as a mask. The etching may remove portions of the topmost layers of the isolation layers 103 and the dummy layers 203 exposed in the second staircase region 1303 and in the first staircase region 1301 such that the next layer down of the isolation layers 103 in the multi-layer stack 201 is exposed in each of the first staircase region 1301 and the second staircase region 1303.

Once the next layer down of the isolation layers 103 in the multi-layer stack 201 has been exposed in each of the first staircase region 1301 and the second staircase region 1303, the photoresist may be trimmed again to expose yet another portion of the multi-layer stack 201 in a third staircase region 1305 while masking remaining portions of the multi-layer stack 201. The trimming of the photoresist and the staircase etching process may be repeated until a desired number of staircase regions have been exposed. In the illustrated embodiment, three of the staircase regions are exposed with the last trimming of the photoresist exposing the third staircase region 1305. However, more of fewer staircase regions may be formed. For example in a multi-layer stack 201 comprising a lesser number of source lines 105 or bit lines 107 (e.g., two), fewer staircase regions (e.g., two) may be formed. As another example in a multi-layer stack 201 comprising a greater number of source lines 105 or bit lines 107 (e.g., four, five, six, . . . etc.), more staircase regions (e.g., four, five, six, . . . etc.) may be formed.

Once the desired number (e.g., three) of the staircase regions have been exposed, staircase contact areas 1307 are exposed by using the trimmed photoresist as a mask and etching the exposed portions of the isolation layers 103 in the staircase regions. The etching may remove portions of the topmost layers of the isolation layers 103 such that the next layer down of the metal fill material 1001 in the multi-layer stack 201 are exposed in each of the first staircase region 1301, the second staircase region 1303, and the third staircase region 1305. These exposed portions of the metal fill material 1001 may serve as the staircase contact areas 1307.

FIG. 13 further illustrates a formation of conductive contacts 1309 over the staircase contact areas 1307 and the word lines 109, according to some embodiments. The conductive contacts 1309, the staircase contact areas 1307 and isolation layers 103 adjacent the memory array 100 may be collectively referred to as a staircase contact structure 1313. The staircase contact structures 1313 of arrays adjacent to the 3D memory array 100 may be separated by the third width W3 of the array spacers 117.

The conductive contacts 1309 provide external connectivity to the word lines 109, source lines 105 and bit lines 107 of the 3D memory array 100. For example, the conductive contacts 1309 may electrically connect the 3D memory array 100 to other active devices and/or signal, power, and ground lines in a semiconductor die. Accordingly, the first 3D-NOR memory device 1300 may be completed.

In an embodiment in which the conductive contacts 1309 are conductive pillars (e.g., tungsten, copper, aluminum, titanium, alloys, combinations, or the like), the conductive contacts 1309 may be formed by initially forming an interlayer dielectric (ILD) layer (not shown) over the first region 205 and the second region 207 of the multi-layer stack 201. Once formed, the interlayer dielectric layer is patterned using suitable photolithographic and etching processes to form openings through the interlayer dielectric layer and expose areas of the word lines 109 and/or the staircase contact areas 1307 in desired locations of the conductive contacts 1309. Once the openings have been formed, the openings may be filled and/or overfilled with a conductive fill material (e.g., W, Al, Cu, or the like) using a suitable deposition process (e.g., chemical vapor deposition (CVD), physical vapor deposition (PVD), or the like). Once deposited, a planarization process may be performed to planarize the top surfaces of the conductive contacts 1309 to be co-planar with a surface of the interlayer dielectric layer. Once the conductive contacts 1309 have been formed, the interlayer dielectric layer (not shown) may remain to allow for further processing of the first 3D-NOR memory device 1300, according to some embodiments.

Although the embodiment of FIG. 13 illustrates a particular pattern for the staircase contact structures 1313, other configurations are also possible. For example, in the illustrated embodiment, the source lines 105 and the bit lines 107 that are in a same row of the array are all aligned with each other and the staircase contact areas 1307 of the bit lines 107 are formed on a same side of the 3D memory array 100 as the source lines 105. However, in other embodiments, the staircase contact areas 1307 of bit lines 107 may be formed on a side of the 3D memory array 100 opposite from the staircase contact areas 1307 of source lines 105. Furthermore, the word lines 109 of an adjacent memory array may be aligned with the word lines 109 of the 3D memory array 100, although the word lines 109 of one memory array may also be offset from the word lines 109 of an adjacent memory array such that the word lines 109 and thus the conductive contacts 1309 connected to the word lines 109 have a staggered pattern from one memory array to the next memory array.

Figure 14A:
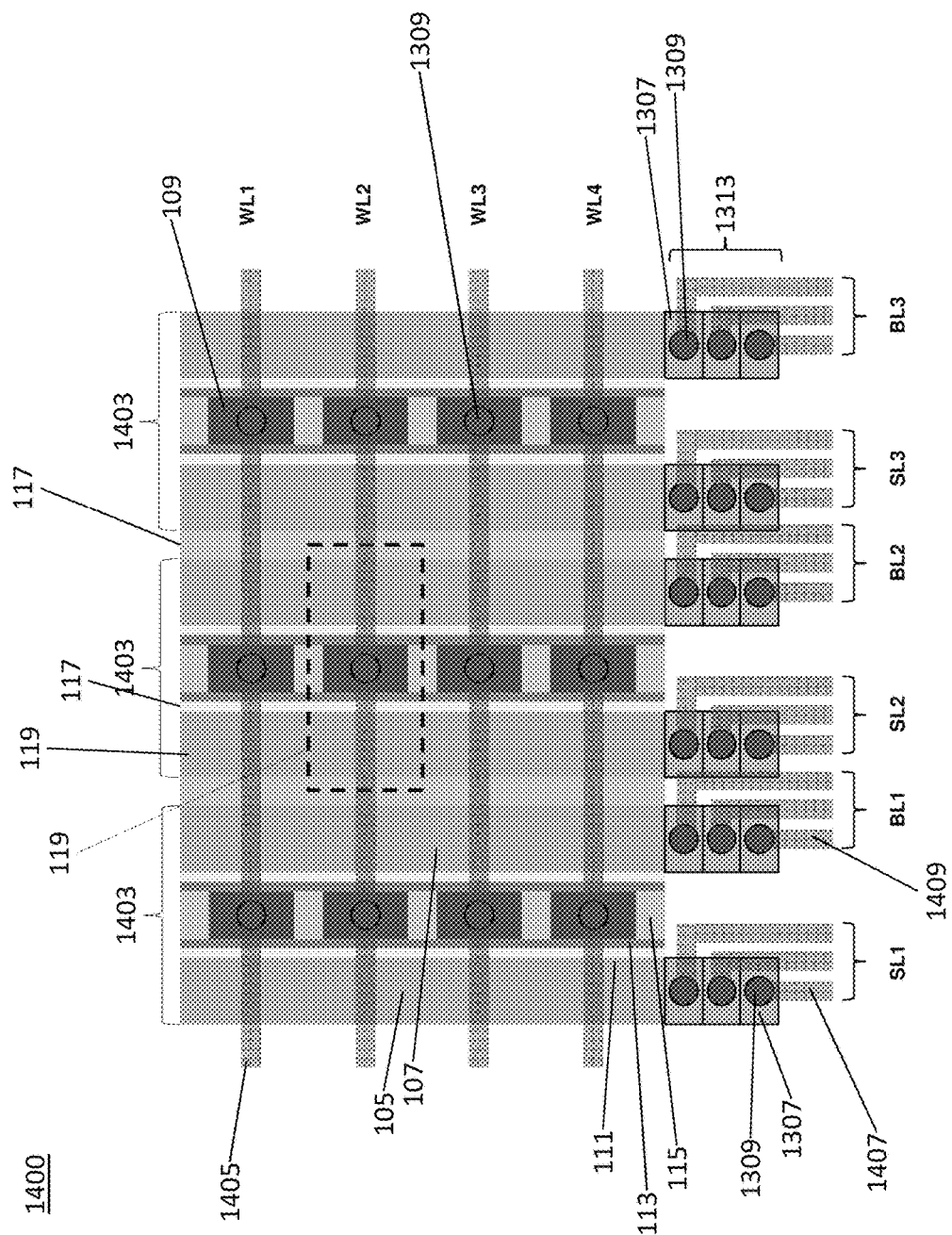
FIG. 14A illustrates a top-down view of another 3D NOR memory device, according to some embodiments.

FIG. 14A illustrates a top-down view of a second 3D-NOR memory device 1400, according to some embodiments. In FIG. 14A, the topmost layer of the isolation layers 103 has been removed for illustration purposes to allow the underlying structures to be seen. The second 3D-NOR memory device 1400 comprises a plurality of second 3D-memory arrays 1403 and a plurality of the staircase contact structures 1313. Each of the second 3D-memory arrays 1403 comprises four of the word lines 109 and a pair of the staircase contact structures 1313. Each pair of the staircase contact structures 1313 are associated with three staircase contact areas 1307 of the source lines 105 and three staircase contact areas 1307 of the three bit lines 107. In the illustrated embodiment, sets of source lines 105 are designated (e.g., SL1, SL2, SL3) and sets of bit lines 107 are designated (e.g., BL1, BL2, BL3) and each of these sets is associated with one of the second 3D-memory arrays 1403.

In the illustrated embodiment, each of a plurality of conductive source line structures 1407 are connected to the conductive contacts 1309 of the source lines 105, respectively for external connection to the second 3D-NOR memory device 1400 and each of a plurality of conductive bit line structures 1409 are connected to the conductive contacts 1309 of the bit lines 107, respectively for external connection to the second 3D-NOR memory device 1400. However, in some embodiments, one or more of the conductive contacts 1309 of the source lines 105 may be connected to one of the conductive source line structures 1407 for external connection to the second 3D-NOR memory device 1400 and/or one or more of the conductive contacts 1309 of the bit lines 107 may be connected to one of the conductive bit line structures 1409 for external connection to the second 3D-NOR memory device 1400.

FIG. 14A further illustrates a unit memory cell 123 of one of the second 3D-memory arrays 1403 highlighted with a dashed line. According to some embodiments, the word lines 109 of adjacent ones of the second 3D-memory arrays 1403 are aligned with one another. In other embodiments, the word lines 109 of adjacent ones of the second 3D-memory arrays 1403 may be offset from one another having a staggered pattern from one memory array to the next memory array. According to some embodiments, conductive word line structures 1405 may be formed to the conductive contacts 1309 to externally connect the word lines 109 of the second 3D-memory arrays 1403 to external devices. In the illustrated embodiment, the word lines 109 of adjacent ones of the second 3D-memory arrays 1403 are electrically connected to one another by one of the conductive word line structures 1405 and are designated (e.g., WL1, WL2, WL3, WL4) as being associated with a set of word lines 109 that are connected. In embodiments which have word lines 109 in a staggered arrangement, the conductive word line structures 1405 may connect the word lines 109 that are aligned with other word lines 109 of the staggered arrangement one to another within the second 3D-memory arrays 1403.

Figure 14B:
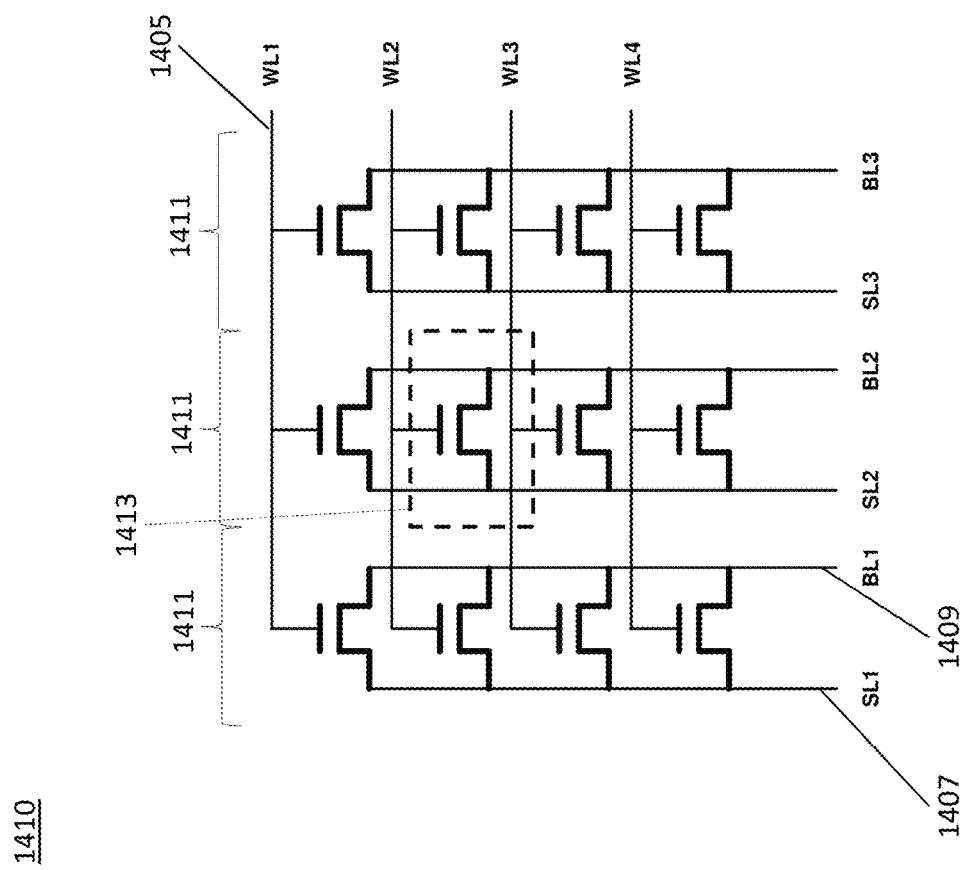
FIG. 14B illustrates a schematic diagram of an equivalent circuit of the 3D NOR memory device illustrated in FIG. 14A.

FIG. 14B is a schematic diagram of an equivalent circuit 1410 of the second 3D-NOR memory device 1400 illustrated in the FIG. 14A. In particular, FIG. 14B illustrates three columns 1411 of four of the circuit elements 1413 representing the second 3D-memory arrays 1403 with the conductive word line structures 1405 associated with sets of the word lines 109 of the second 3D-memory arrays 1403 and are designated (e.g., WL1, WL2, WL3, WL4). FIG. 14B further illustrates the conductive source line structures 1407 associated with the stack of source lines 105 (e.g., SL1, SL2, SL3) of the second 3D-memory arrays 1403 and the conductive bit line structures 1409 associated with the stack of bit lines 107 (e.g., BL1, BL2, BL3) of the second 3D-memory arrays 1403. FIG. 14B further illustrates the circuit element 1413 of the equivalent circuit 1410 associated with the unit memory cell 123 highlighted with the dashed line in FIG. 14A.

Various embodiments provide a 3D-NOR memory array 100 with a plurality of vertically stacked memory cells 125 which provide one or more of the following advantages and/or benefits. For example, by forming the 3D-NOR memory array 100 as described above, the manufacturing production of a large array of devices can be simplified and material costs savings can be achieved. Additionally, with the isolation layers 103 separating the source lines 105 and bit lines 107, disturbances in read/write operations of the 3D-NOR memory array 100 are reduced. As such, production yield and device performance are increased.

In an embodiment, a method includes: forming a multi-layer stack over a substrate, the multi-layer stack including alternating layers of an isolation material and a dummy material; forming an array of dummy nanostructures in a channel region of the multi-layer stack; depositing a semiconductor material surrounding the array of dummy nanostructures; depositing a memory film around the semiconductor material; and forming a conductive structure around the memory film. In an embodiment of the method, forming the multi-layer stack includes using a first material for the isolation material and using a second material for the dummy material, the second material being different from the first material. In an embodiment, the method further includes forming source/bit line structures by replacing the dummy material located outside of the channel region with a conductive material. In an embodiment, the method further includes forming a staircase contact structure from the source/bit line structures outside of the channel region. In an embodiment, forming the source/bit line structures further includes forming recesses within the dummy nanostructures. In an embodiment, the method further includes filling the recesses with the conductive material. In an embodiment, the method further includes: etching an opening through the conductive structure, the memory film, and the semiconductor material in a location between adjacent stacks of the array of dummy nanostructures; and depositing a dielectric material in the opening.

In another embodiment, a method includes: depositing a first material over a substrate; forming a multi-layer stack by depositing a second material over the first material; forming a fin in a channel region of the multi-layer stack; forming a dummy channel core by removing the first material from the fin; depositing a semiconductor material over and surrounding the dummy channel core; depositing a memory film layer over the semiconductor material; forming a conductive structure over the memory film layer; and replacing remaining portions of the second material located outside of the channel region with a conductive material. In an embodiment of the method, depositing the semiconductor material deposits an oxide material. In an embodiment of the method, the oxide material is indium gallium zinc oxide. In an embodiment, replacing the remaining portions of the second material includes forming slits in the multi-layer stack on opposite sides of the dummy channel core. In an embodiment, replacing the remaining portions of the second material further includes etching the second material exposed along sidewalls of the slits. In an embodiment, replacing the remaining portions of the second material further includes forming recesses within the dummy channel core. In an embodiment, the method further includes forming a staircase contact structure in electrical connection with the conductive material. In an embodiment of the method, depositing the memory film layer includes depositing a ferroelectric material.

In yet another embodiment, a device includes: a memory cell stack including a stack of dummy nanostructure cores; a semiconductor wrap-around channel structure surrounding each one of the dummy nanostructure cores; a memory film surrounding the semiconductor wrap-around channel structure; and a wrap-around word line surrounding the semiconductor wrap-around channel structure. In an embodiment, the device further includes a stack of source line structures and a stack of bit line structures, each bit line structure within the stack of bit line structures being separated from a corresponding one of the source line structures within the stack of source line structures by a corresponding one of the dummy nanostructure cores within the stack of dummy nanostructure cores. In an embodiment of the device, the stack of source line structures and the stack of bit line structures are separated from the wrap-around word line by the semiconductor wrap-around channel structure. In an embodiment, the device further includes a stack of isolation regions, wherein the stack of source line structures are isolated from one another by the stack of isolation regions. In an embodiment of the device, the semiconductor wrap-around channel structure is an oxide semiconductor film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a multi-layer stack over a substrate, the multi-layer stack comprising alternating layers of an isolation material and a dummy material;
forming an array of dummy nanostructures in a channel region of the multi-layer stack;
depositing a semiconductor material surrounding the array of dummy nanostructures;
depositing a memory film around the semiconductor material; and
forming a conductive structure around the memory film.

2. The method of claim 1, wherein the forming the multi-layer stack comprises using a first material for the isolation material and using a second material for the dummy material, the second material being different from the first material.

3. The method of claim 2, further comprising forming source/bit line structures by replacing the dummy material located outside of the channel region with a conductive material.

4. The method of claim 3, further comprising forming a staircase contact structure from the source/bit line structures outside of the channel region.

5. The method of claim 3, wherein the forming the source/bit line structures further comprises forming recesses within the dummy nanostructures.

6. The method of claim 5, wherein the forming the source/bit lines structures further comprises filling the recesses with the conductive material.

7. The method of claim 1, further comprising:
etching an opening through the conductive structure, the memory film, and the semiconductor material in a location between adjacent stacks of the array of dummy nanostructures; and
depositing a dielectric material in the opening.

8. A method comprising:
depositing a first material over a substrate;
forming a multi-layer stack by depositing a second material over the first material;
forming a fin in a channel region of the multi-layer stack;
forming a dummy channel core by removing the first material from the fin;
depositing a semiconductor material over and surrounding the dummy channel core;
depositing a memory film layer over the semiconductor material;
forming a conductive structure over the memory film layer; and
replacing remaining portions of the second material located outside of the channel region with a conductive material.

9. The method of claim 8, wherein the depositing the semiconductor material deposits an oxide material.

10. The method of claim 9, wherein the oxide material is indium gallium zinc oxide.

11. The method of claim 8, wherein the replacing the remaining portions of the second material further comprises forming slits in the multi-layer stack on opposite sides of the dummy channel core.

12. The method of claim 11, wherein the replacing the remaining portions of the second material further comprises etching the second material exposed along sidewalls of the slits.

13. The method of claim 12, wherein the replacing the remaining portions of the second material further comprises forming recesses within the dummy channel core.

14. The method of claim 8, further comprising forming a staircase contact structure in electrical connection with the conductive material.

15. The method of claim 8, wherein the depositing the memory film layer comprises depositing a ferroelectric material.

16. A device comprising:
a memory cell stack comprising a stack of dummy nanostructure cores;
a semiconductor wrap-around channel structure surrounding each one of the dummy nanostructure cores within the stack of dummy nano structure cores;
a memory film surrounding the semiconductor wrap-around channel structure; and
a wrap-around word line surrounding the semiconductor wrap-around channel structure.

17. The device of claim 16, further comprising a stack of source line structures and a stack of bit line structures, each bit line structure within the stack of bit line structures being separated from a corresponding one of the source line structures within the stack of source line structures by a corresponding one of the dummy nanostructure cores within the stack of dummy nanostructure cores.

18. The device of claim 17, wherein the stack of source line structures and the stack of bit line structures are separated from the wrap-around word line by the semiconductor wrap-around channel structure.

19. The device of claim 17, further comprising a stack of isolation regions, wherein the stack of source line structures are isolated from one another by the stack of isolation regions.

20. The device of claim 16, wherein the semiconductor wrap-around channel structure is an oxide semiconductor film.

\* \* \* \* \*